(12) United States Patent
Park et al.

(10) Patent No.: US 12,237,304 B2
(45) Date of Patent: Feb. 25, 2025

(54) SEMICONDUCTOR PACKAGE

(71) Applicant: SAMSUNG ELECTRONICS CO., LTD., Suwon-si (KR)

(72) Inventors: Minkyeong Park, Hwaseong-si (KR); Do-Hyun Kim, Asan-si (KR); Jaekyu Sung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 17/665,810

(22) Filed: Feb. 7, 2022

(65) Prior Publication Data

US 2023/0005884 A1 Jan. 5, 2023

(30) Foreign Application Priority Data

Jun. 30, 2021 (KR) ........................ 10-2021-0086035

(51) Int. Cl.
*H01L 25/065* (2023.01)
*H01L 23/00* (2006.01)
*H01L 23/498* (2006.01)

(52) U.S. Cl.
CPC .... *H01L 25/0657* (2013.01); *H01L 23/49816* (2013.01); *H01L 24/05* (2013.01);
(Continued)

(58) Field of Classification Search
CPC . H01L 2224/32225; H01L 2224/48137; H01L 2224/48147; H01L 2224/49109; H01L 2224/48145; H01L 2224/49097; H01L 2224/83191; H01L 2224/08145; H01L 2224/40145; H01L 2224/05552; H01L 2224/48091; H01L 2224/48135;
(Continued)

(56) References Cited

U.S. PATENT DOCUMENTS 6,476,506 B1 * 11/2002 O'Connor ............... H01L 24/06
257/773
7,489,035 B2 2/2009 Song et al.
(Continued)

FOREIGN PATENT DOCUMENTS

JP 2020-150145 A 9/2020
KR 10-0592787 B1 6/2006

*Primary Examiner* — Shaun M Campbell
*Assistant Examiner* — Teresa M. Arroyo
(74) *Attorney, Agent, or Firm* — Muir Patent Law, PLLC

(57) ABSTRACT

A semiconductor package including a package substrate including first and second bonding pads, third bonding pads spaced apart from the first bonding pads, and fourth bonding pads spaced apart from the second bonding pads; a first chip stack including first chips stacked on the package substrate, each first chip including first signal pads and first power/ground pads alternately arranged; a second chip stack including second chips stacked on the first chip stack, each second chip including second signal pads and second power/ground pads alternately arranged; first lower wires that connect the first signal pads to the first bonding pads; second lower wires that connect the first power/ground pads to the second bonding pads; first upper wires that connect the second signal pads of the second chips to the third bonding pads; and second upper wires that connect the second power/ground pads of the second chips to the fourth bonding pads.

20 Claims, 30 Drawing Sheets

(52) U.S. Cl.
CPC .............. *H01L 24/48* (2013.01); *H01L 24/49* (2013.01); *H01L 24/73* (2013.01); *H01L 2224/05552* (2013.01); *H01L 2224/48091* (2013.01); *H01L 2224/48135* (2013.01); *H01L 2224/48227* (2013.01); *H01L 2224/73265* (2013.01)

(58) Field of Classification Search
CPC . H01L 2224/48227; H01L 2224/73265; H01L 2224/02166; H01L 2224/04042; H01L 2224/05554; H01L 2224/32145; H01L 25/043; H01L 25/0657; H01L 25/0756; H01L 25/117; H01L 25/0652; H01L 25/18; H01L 23/49816; H01L 23/3107; H01L 23/49811; H01L 23/49838; H01L 23/50; H01L 23/5286; H01L 2924/00014; H01L 2924/15311; H01L 2924/181; H01L 2924/381; H01L 2225/06506; H01L 2225/0651; H01L 2225/06562; H01L 2225/06503; H01L 2225/06555; H01L 24/05; H01L 24/48; H01L 24/49; H01L 24/73; H01L 24/06; H01L 24/32; H01L 24/83; H01L 24/04; H01L 2924/00012; H01L 2224/45099
See application file for complete search history.

(56) References Cited

U.S. PATENT DOCUMENTS

| | | | |
|---|---|---|---|
| 8,243,465 B2 | 8/2012 | Itaya et al. | |
| 8,611,125 B2 | 12/2013 | Hong | |
| 9,318,420 B2 | 4/2016 | Kim | |
| 9,589,930 B2 | 3/2017 | Park et al. | |
| 9,595,489 B2 | 3/2017 | Katagiri et al. | |
| 9,947,644 B2 | 4/2018 | Hong et al. | |
| 10,403,605 B2 | 9/2019 | Nakase et al. | |
| 11,037,879 B2 | 6/2021 | Otsuka | |
| 2008/0122064 A1* | 5/2008 | Itoh | H01L 25/0657 257/E23.079 |
| 2009/0057916 A1* | 3/2009 | Yeom | H01L 25/0657 257/E23.024 |
| 2012/0248439 A1* | 10/2012 | Lee | H01L 23/49838 257/777 |
| 2013/0062783 A1* | 3/2013 | Lin | H01L 23/49838 257/782 |
| 2013/0062784 A1* | 3/2013 | Hong | H05K 3/284 257/777 |
| 2013/0256917 A1* | 10/2013 | Kim | H01L 25/18 257/777 |
| 2014/0103542 A1* | 4/2014 | Katagiri | H01L 24/05 257/777 |
| 2015/0200187 A1* | 7/2015 | Park | H01L 24/49 257/777 |
| 2016/0099203 A1* | 4/2016 | Kim | H01L 25/0652 257/773 |
| 2018/0182737 A1* | 6/2018 | Nakase | H01L 25/0652 |
| 2022/0139879 A1* | 5/2022 | Park | H01L 25/0657 257/777 |

* cited by examiner

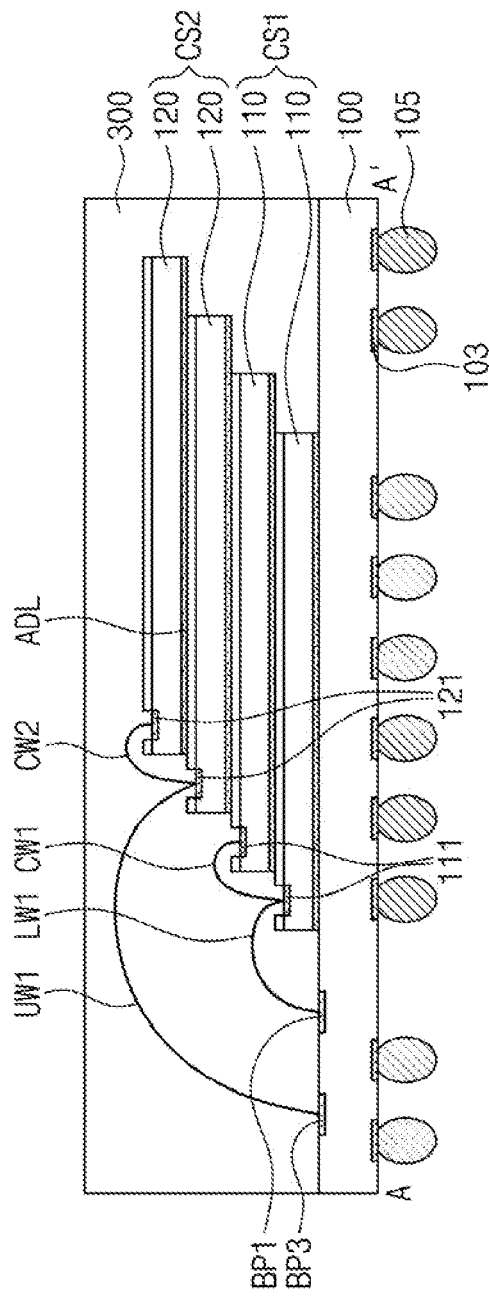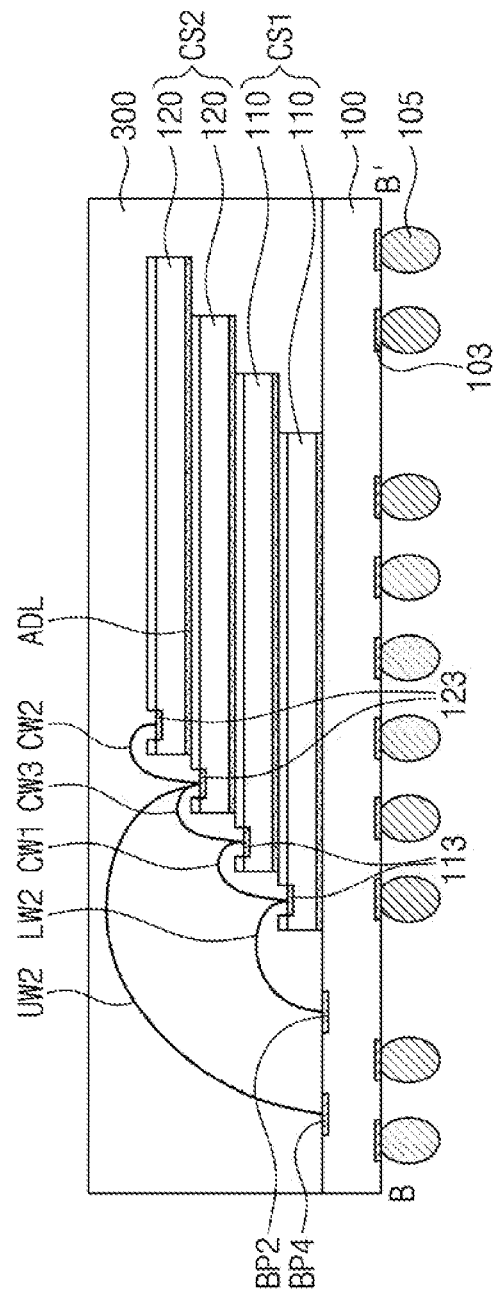

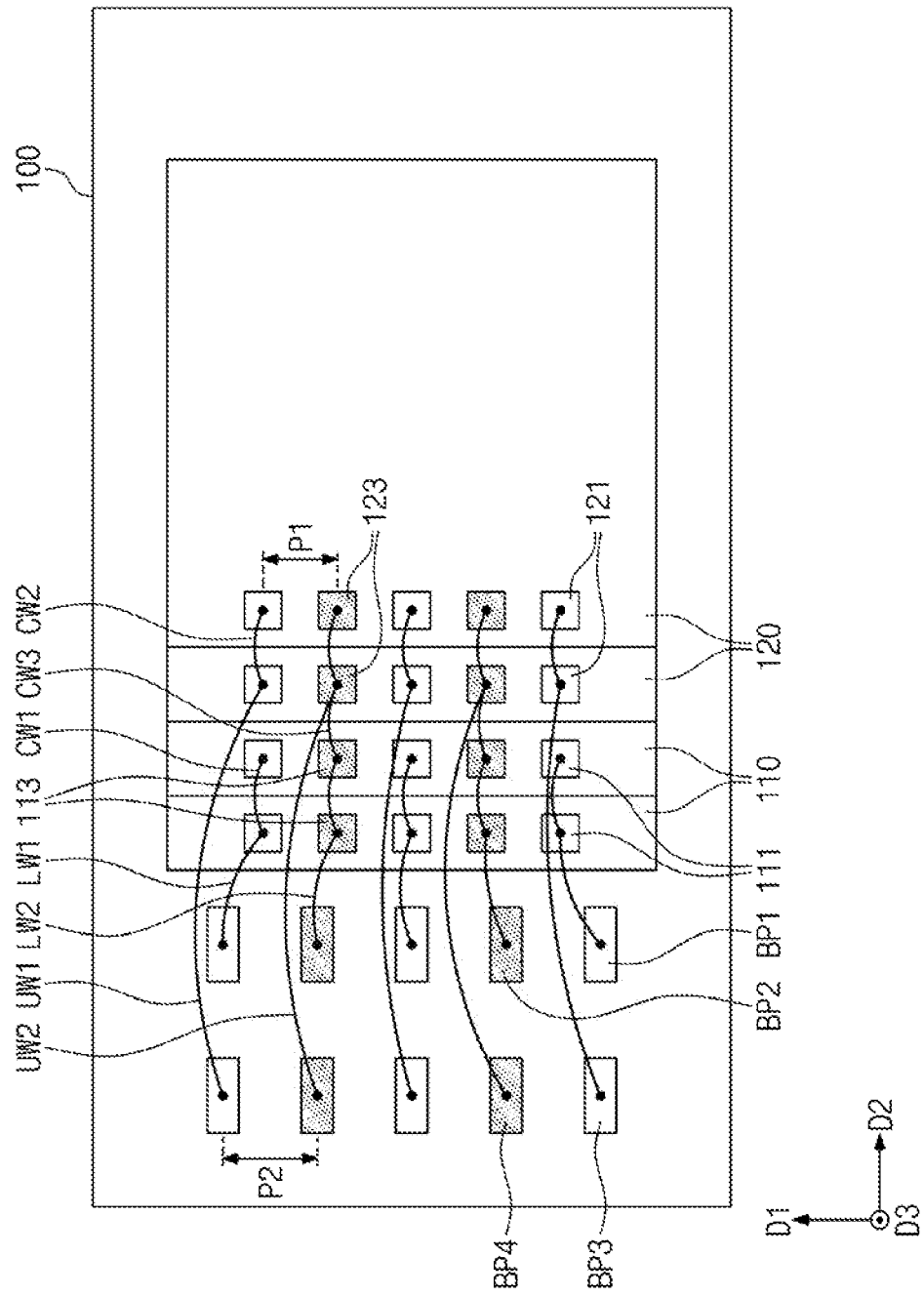

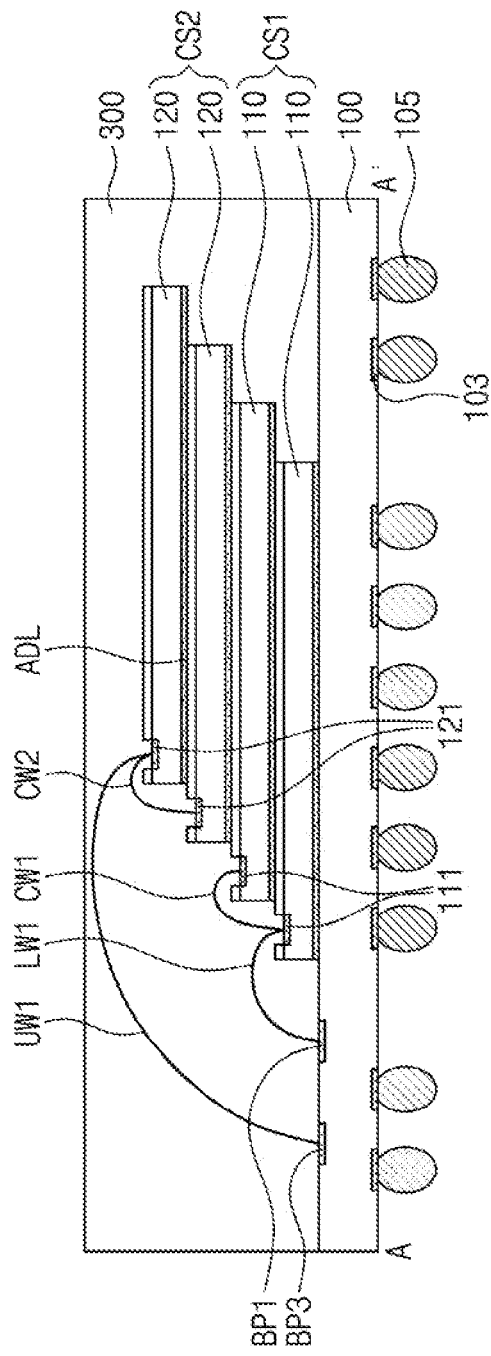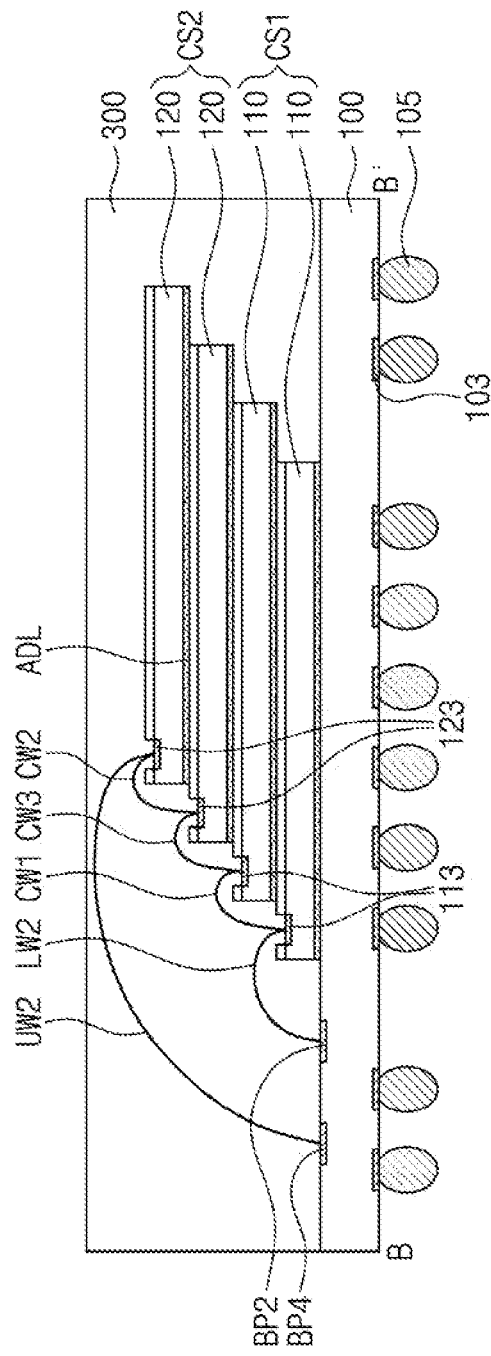

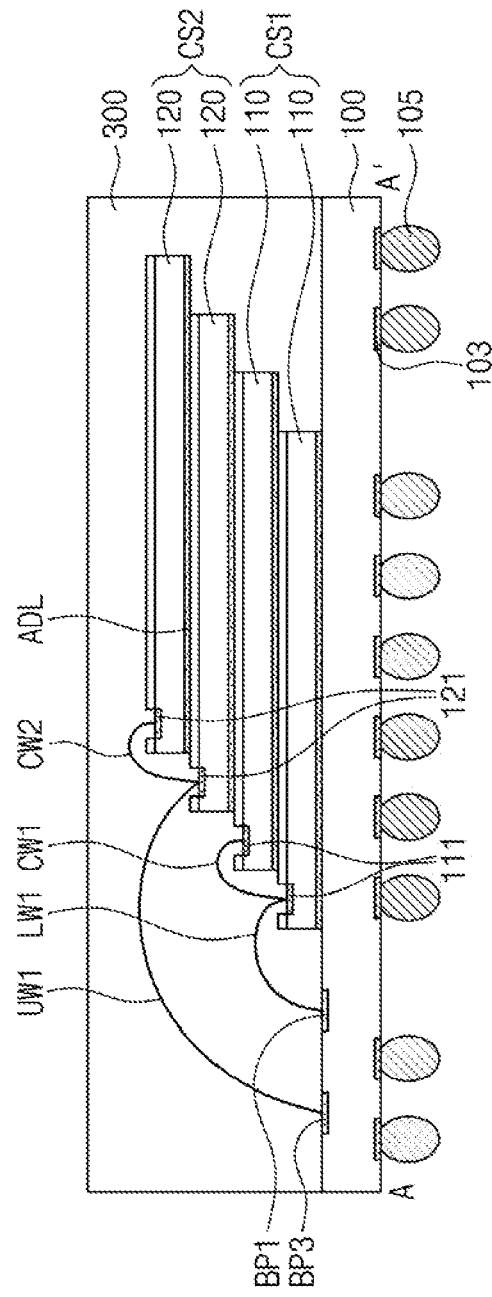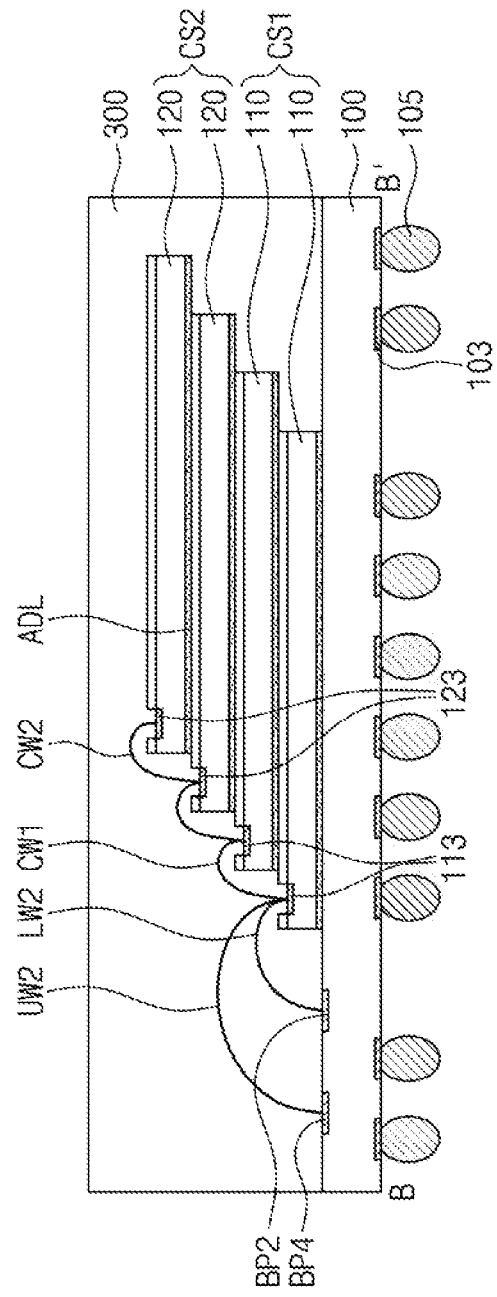

SEMICONDUCTOR PACKAGE

CROSS-REFERENCE TO RELATED APPLICATION

This U.S. nonprovisional application claims priority under 35 U.S.C. § 119 to Korean Patent Application No. 10-2021-0086035 filed on Jun. 30, 2021, in the Korean Intellectual Property Office, the disclosure of which is hereby incorporated by reference in its entirety.

BACKGROUND

1. Field

Embodiments relate to a semiconductor package.

2. Description of the Related Art

A semiconductor package may be provided to implement an integrated circuit chip for use in electronic products. A semiconductor package may be configured such that a semiconductor chip is mounted on a printed circuit board and bonding wires or bumps are used to electrically connect the semiconductor chip to the printed circuit board.

SUMMARY

The embodiments may be realized by providing a semiconductor package including a package substrate including first bonding pads and second bonding pads that are alternately arranged along a first direction, third bonding pads that are spaced apart from the first bonding pads in a second direction intersecting the first direction, and fourth bonding pads that are spaced apart from the second bonding pads in the second direction; a first chip stack including first chips that are stacked on the package substrate, each first chip including first signal pads and first power/ground pads that are alternately arranged along the first direction; a second chip stack including second chips that are stacked on the first chip stack, each second chip including second signal pads and second power/ground pads that are alternately arranged along the first direction; first lower wires that connect the first signal pads of one of the first chips to the first bonding pads; second lower wires that connect the first power/ground pads of one of the first chips to the second bonding pads; first upper wires that connect the second signal pads of one of the second chips to the third bonding pads; and second upper wires that connect the second power/ground pads of one of the second chips to the fourth bonding pads.

The embodiments may be realized by providing a semiconductor package including a first chip stack including first chips that are stacked on a package substrate, each of the first chips including first signal pads and first power/ground pads that are alternately arranged along a first direction; a second chip stack including second chips that are stacked on the first chip stack, each of the second chips including second signal pads and second power/ground pads that are alternately arranged along the first direction; lower wires that connect the first chip stack to the package substrate; upper wires that connect the second chip stack to the package substrate; first connection wires that connect the first power/ground pads of the first chips; second connection wires that connect the second power/ground pads of the second chips; and third connection wires that connect adjacent ones of the first power/ground pads and the second power/ground pads of the first chips and the second chips, wherein each of the second power/ground pads of one of the second chips is connected in common to one of the upper wires, one of the second connection wires, and one of the third connection wires.

The embodiments may be realized by providing a semiconductor package including a package substrate including first bonding pads and second bonding pads that are alternately arranged along a first direction, third bonding pads that are spaced apart from the first bonding pads in a second direction intersecting the first direction, and fourth bonding pads that are spaced apart in the second direction from the second bonding pads; a first chip stack including first chips that are stacked on the package substrate, each of the first chips including first signal pads and first power/ground pads that are alternately arranged along the first direction; a second chip stack including second chips that are stacked on the first chip stack, each of the second chips including second signal pads and second power/ground pads that are alternately arranged along the first direction; a third chip that is spaced apart from the first chip stack and the second chip stack and is on the package substrate, the third chip including first chip pads and second chip pads that are arranged along the first direction; first connection wires that connect the first power/ground pads of the first chips; second connection wires that connect the second power/ground pads of the second chips; third connection wires that connect adjacent first power/ground pads and second power/ground pads of the first chips and the second chips; first lower wires that connect the first signal pads of one of the first chips to the first bonding pads; second lower wires that connect the first power/ground pads of one of the first chips to the second bonding pads; first upper wires that connect the second signal pads of one of the second chips to the first chip pads of the third chip; and second upper wires that connect the second power/ground pads of one of the second chips to the second chip pads of the third chip.

BRIEF DESCRIPTION OF THE DRAWINGS

Features will be apparent to those of skill in the art by describing in detail exemplary embodiments with reference to the attached drawings in which:

FIGS. 3A and 3B illustrate cross-sectional views taken along lines A-A' and B-B' of FIG. 2.

FIG. 4 illustrates a plan view of a semiconductor package according to some embodiments.

FIGS. 6A and 6B illustrate cross-sectional views taken along lines A-A' and B-B' of FIG. 5.

FIGS. 8A and 8B illustrate cross-sectional views taken along lines A-A' and B-B' of FIG. 7.

DETAILED DESCRIPTION

Figure 1:
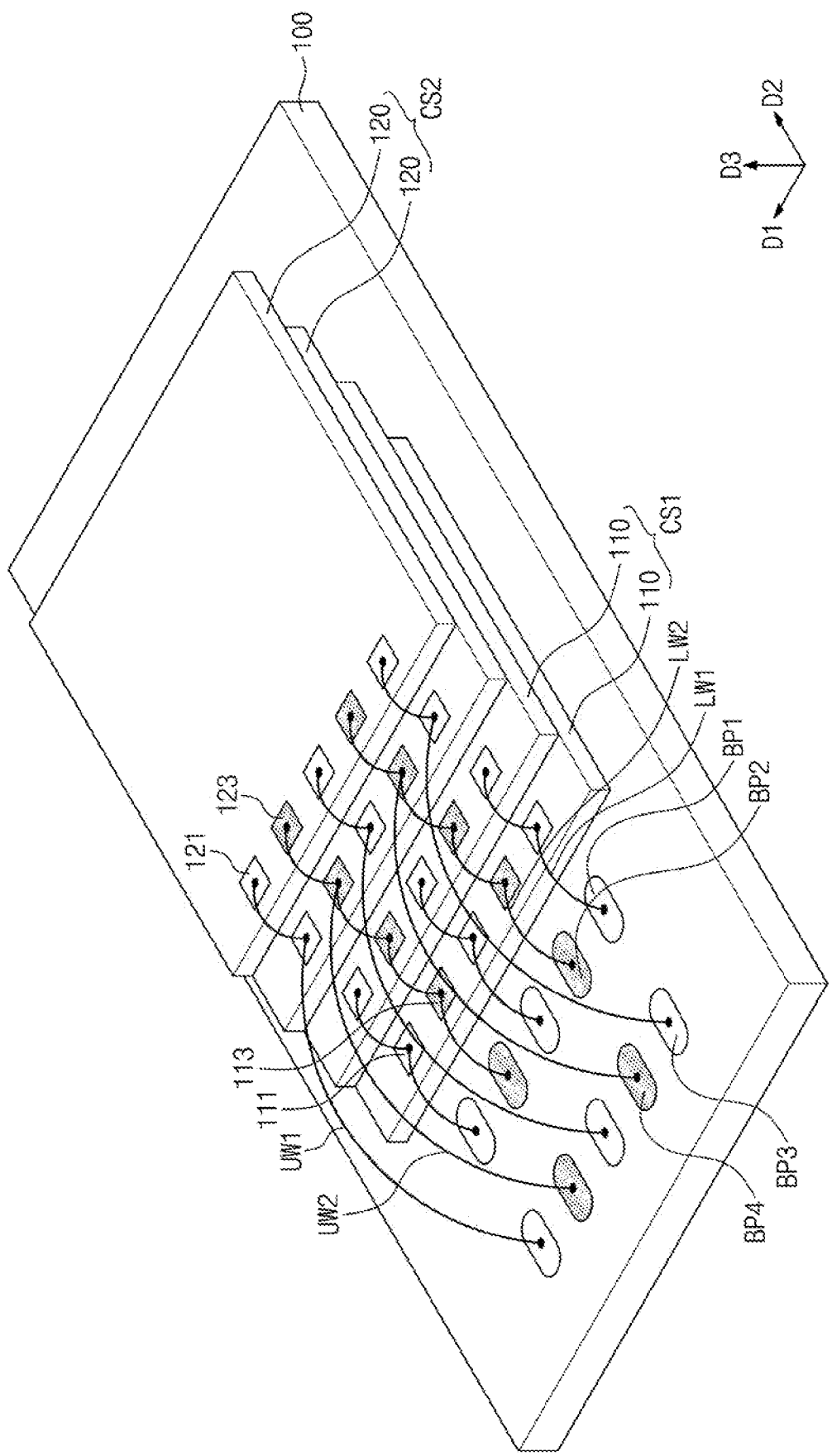
FIG. 1 illustrates a perspective view of a semiconductor package according to some embodiments.
Figure 2:
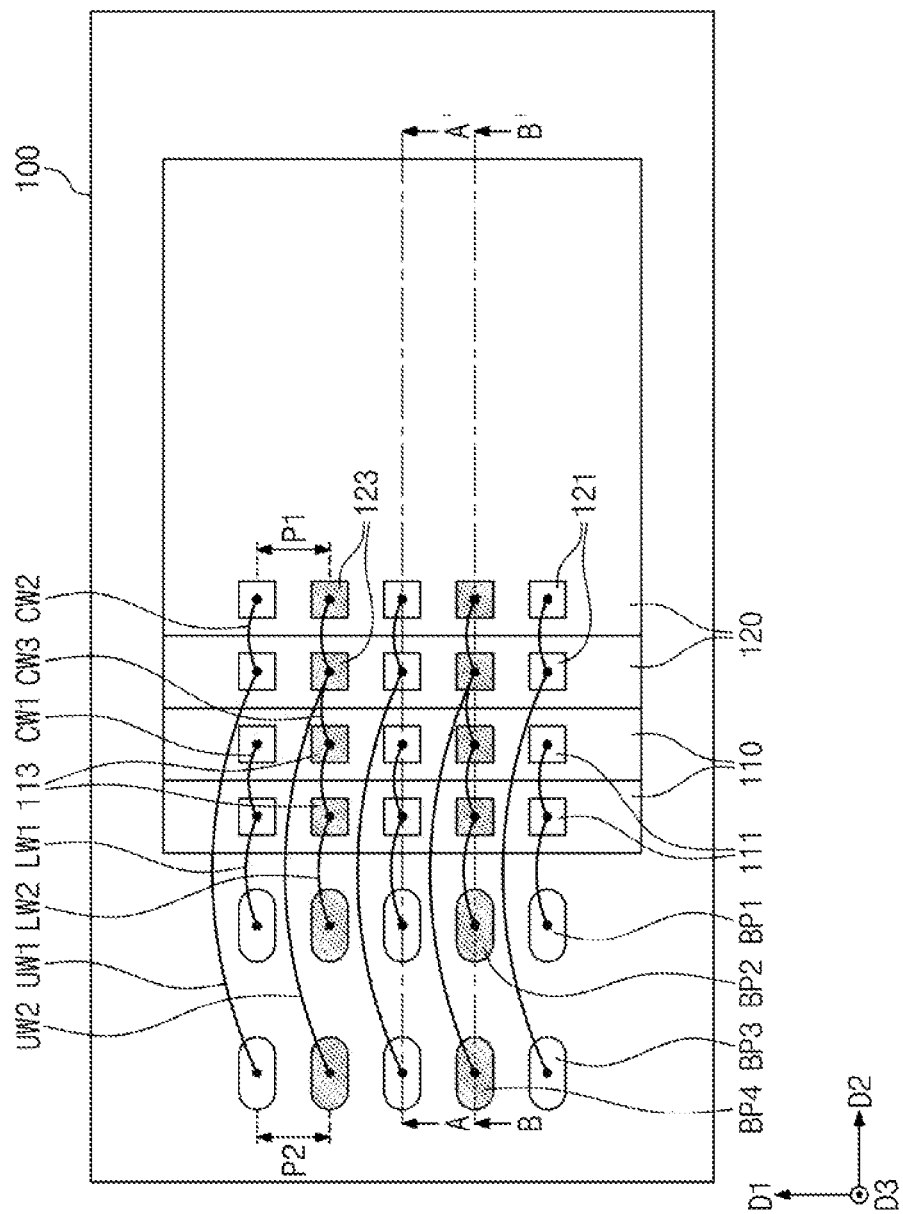
FIG. 2 illustrates a plan view of a semiconductor package according to some embodiments.

FIG. 1 illustrates a perspective view of a semiconductor package according to some embodiments. FIGS. 2 and 4 illustrate plan views of a semiconductor package according to some embodiments. FIGS. 3A and 3B illustrate cross-sectional views taken along lines A-A' and B-B' of FIG. 2.

Referring to FIGS. 1, 2, 3A, and 3B, a semiconductor package may include a package substrate 100, a first chip stack CS1 on the package substrate 100, a second chip stack CS2 on the first chip stack CS1, first and second upper wires UW1 and UW2, first and second lower wires LW1 and LW2, first, second, and third connection wires CW1, CW2, and CW3, and a molding layer 300. As used herein, the terms "first," "second," and the like are merely for identification and differentiation, and are not intended to imply or require sequential inclusion (e.g., a third element and a fourth element may be described without implying or requiring the presence of a first element or second element), nor are they intended to be fixed to a particular element.

A printed circuit board (PCB), a flexible substrate, a tape substrate, or another suitable kind of substrate may be used as the package substrate 100. In an implementation, the package substrate 100 may be a printed circuit board in which internal lines are formed. The package substrate 100 may include bonding pads BP1 to BP4 on a top surface thereof and coupling pads 103 on a bottom surface thereof. The bonding pads BP1 to BP4 may be electrically connected through the internal lines to the coupling pads 103. The bonding pads BP1 to BP4 may be electrically connected through metallic wires to chip pads of the first and second chip stacks CS1 and CS2. The coupling pads 103 may be attached to connection terminals 105 such as solder balls or solder bumps.

In an implementation, the bonding pads BP1 to BP4 may include first and second bonding pads BP1 and BP2 that are alternately arranged along a first direction D1 parallel to the top surface of the package substrate 100, third bonding pads BP3 that are spaced apart from the first bonding pads BP1 in a second direction D2 intersecting the first direction D1, and fourth bonding pads BP4 that are spaced apart in the second direction D2 from the second bonding pads BP2.

The first and second bonding pads BP1 and BP2 may be closer (e.g., in the second direction D2) to the first chip stack CS1 than the third and fourth bonding pads BP3 and BP4 are to the first chip stack CS1. A distance (e.g., in the second direction D2) between the first bonding pads BP1 and the third bonding pads BP3 may be substantially the same as a distance between the second bonding pads BP2 and the fourth bonding pads BP4.

The first and third bonding pads BP1 and BP3 may be connected to signal terminals, and the second and fourth bonding pads BP2 and BP4 may be connected to power/ground terminals. In an implementation, as illustrated in the drawings, the number of the first bonding pads BP1 and of the third bonding pads BP3 may be three, and the number of the second bonding pads BP2 and of the fourth bonding pads BP4 may be two.

The first chip stack CS1 may include a plurality of first chips 110 that are stacked through one or more adhesion layers ADL on the package substrate 100. The first chips 110 may be stacked (e.g., offset) along the second direction D2 on the package substrate 100, constituting a staircase or cascade structure.

Each of the first chips 110 may have a structure in which chip pads are arranged on an edge of the first chip 110, and the first chips 110 may be stacked such that each of the first chips 110 may expose chip pads of its underlying first chip 110.

Each of the first chips 110 may include first signal pads 111 through which signals are input and output, and may further include first power/ground pads 113 through which power or ground signals are input. The first signal pads 111 and the first power/ground pads 113 may be alternately arranged along the first direction D1.

The first chips 110 may be memory chips that store data. In an implementation, the first chips 110 may be dynamic random access memory (DRAM) chips, static random access memory (SRAM) chips, NAND Flash memory chips, phase change random access memory (PRAM) chips, resistive random access memory (RRAM) chips, ferromagnetic random access memory (FeRAM) chips, or magnetic random access memory (MRAM) chips.

The second chip stack CS2 may include a plurality of second chips 120 that are stacked through one or more adhesion layers ADL on the first chip stack CS1. The second chips 120 may be stacked along the second direction D2 on the first chip stack CS1, constituting a staircase or cascade structure. The second chips 120 may be attached to each other through the adhesion layer ADL. The second chips 120 may be memory chips that store data and may have the same properties as those of the first chips 110.

Each of the second chips 120 may have a structure in which chip pads are arranged on an edge of the second chip 120, and the second chips 120 may be stacked such that each of the second chips 120 may expose chip pads of its underlying second chip 120.

Each of the second chips 120 may include second signal pads 121 through which signals are input and output, and may further include second power/ground pads 123 through which power or ground signals are input. The second signal pads 121 and the second power/ground pads 123 may be alternately arranged along the first direction D1.

Chip pads of each of the first and second chips 110 and 120 may be arranged along the first direction D1 at a first pitch P1, and on the package substrate 100, the first and second bonding pads BP1 and BP2 (or the third and fourth bonding pads BP3 and BP4) may be arranged along the first direction D1 at a second pitch P2. In an implementation, the second pitch P2 may be substantially the same as the first pitch P1. In an implementation, the first pitch P1 may range from about 50 μm to about 200 μm.

In an implementation, referring to FIG. 4, on the package substrate 100, the first and second bonding pads BP1 and BP2 (or the third and fourth bonding pads BP3 and BP4) may be arranged along the first direction D1 at a second pitch P2, and the second pitch P2 may be greater than the first pitch P1 of chip pads on each of the first and second chips 110 and 120.

In an implementation, as illustrated in the drawings, the bonding pads BP1 to BP4 may each have a size greater than that of each of the chip pads 111, 113, 121, and 123 of the first and second chips 110 and 120, or the bonding pads may have a size substantially the same as that of chip pads.

In an implementation, input/output signals of the first chips 110 and input/output signals of the second chips 120 may be output through different channels from each other. The first signal pads 111 of the first chips 110 may be electrically separated from the second signal pads 121 of the second chips 120. The first power/ground pads 113 of the first chips 110 may be electrically connected to the second power/ground pads 123 of the second chips 120.

The first connection wires CW1 may electrically connect chip pads of the first chips 110 to each other. In an implementation, the first signal pads 111 of the first chips 110 may be connected to each other through the first connection wires CW1, and the first power/ground pads 113 of the first chips 110 may be connected to each other through the first connection wires CW1.

The second connection wires CW2 may electrically connect chip pads of the second chips 120 to each other. In an implementation, the second signal pads 121 of the second chips 120 may be connected to each other through the second connection wires CW2, and the second power/ground pads 123 of the second chips 120 may be connected to each other through the second connection wires CW2.

The third connection wires CW3 may connect the first power/ground pads 113 of an uppermost first chip 110 to the second power/ground pads 123 of a lowermost second chip 120.

The first lower wires LW1 may connect the first signal pads 111 of a lowermost first chip 110 of the first chip stack CS1 to the first bonding pads BP1 of the package substrate 100.

The second lower wires LW2 may connect the first power/ground pads 113 of the lowermost first chip 110 to the second bonding pads BP2 of the package substrate 100.

The first upper wires UW1 may connect the second signal pads 121 of the lowermost second chip 120 of the second chip stack CS2 to the third bonding pads BP3 of the package substrate 100. The first upper wires UW1 may pass over the first connection wires CW1 and the first lower wires LW1, thereby being bonded to the third bonding pads BP3. The first upper wires UW1 may be longer than the first lower wires LW1 (e.g., in the second direction D2). The first upper wires UW1 may have a length that is about 2 times to about 10 times that of the first lower wires LW1.

The second upper wires UW2 may connect the second power/ground pads 123 of the lowermost second chip 120 to the fourth bonding pads BP4 of the package substrate 100. The second upper wires UW2 may pass over the first connection wires CW1, the third connection wires CW3, and the second lower wires LW2, thereby being bonded to the fourth bonding pads BP4. The second upper wires UW2 may be longer than the second lower wires LW2. The second upper wires UW2 may have a length substantially the same as that of the first upper wires UW1. The second upper wires UW2 may have a length that is about 2 times to about 10 times that of the second lower wires LW2.

Each of the second upper wires UW2 may be between adjacent ones of the first upper wires UW1. In an implementation, when the second chips 120 are driven to operate, the second upper wires UW2 may shield electrical interference or crosstalk between the first upper wires UW1. Accordingly, it is possible to help reduce or prevent a reduction in operating speed of the second chips 120 and to help improve signal integrity of the semiconductor package.

On the second chip stack CS2, two wires CW2 and UW1 may be bonded to each of the second signal pads 121 of the lowermost second chip 120. In addition, the second chip stack CS2 may be configured such that three wires CW2, CW3, and UW2 may be bonded to each of the second power/ground pads 123 of the lowermost second chip 120.

On the top surface of the package substrate 100, the molding layer 300 may cover the first and second chip stacks CS1 and CS2 and the bonding wires LW1, LW2, UW1, UW2, CW1, CW2, and CW3. The molding layer 300 may have a thickness greater than a sum of thicknesses of the first and second chip stacks CS1 and CS2 (e.g., in a third direction D3). The molding layer 300 may include a dielectric polymer, e.g., an epoxy molding compound (EMC).

The following will discuss semiconductor packages according to various embodiments in conjunction with the accompanying drawings, and like numerals indicate like components. In addition, for brevity of description, omission may be made to avoid repetitive explanations of the same features as those of the embodiments mentioned above, and a difference thereof will be discussed.

Figure 5:
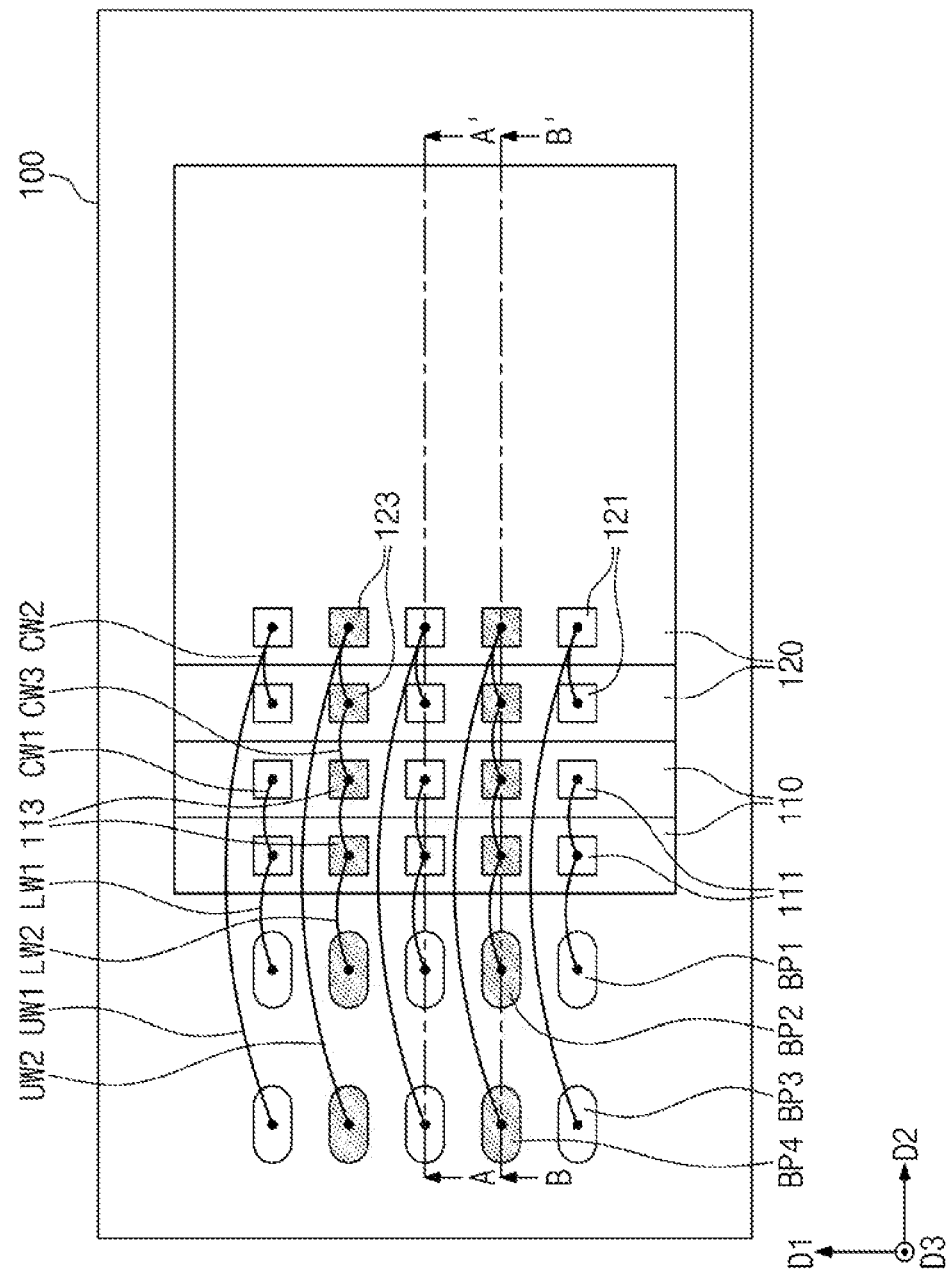
FIG. 5 illustrates a plan view of a semiconductor package according to some embodiments.

FIG. 5 illustrates a plan view of a semiconductor package according to some embodiments. FIGS. 6A and 6B illustrate cross-sectional views taken along lines A-A' and B-B' of FIG. 5.

Referring to FIGS. 5, 6A, and 6B, the first and second upper wires UW1 and UW2 may be electrically connected to an uppermost second chip 120 of the second chip stack CS2. In an implementation, the first upper wires UW1 may connect the second signal pads 121 of the uppermost second chip 120 of the second chip stack CS2 to the third bonding pads BP3 of the package substrate 100. The second upper wires UW2 may connect the second power/ground pads 123 of the uppermost second chip 120 to the fourth bonding pads BP4 of the package substrate 100.

According to the present embodiment, two bonding wires may be bonded to each of chip pads included in the first and second chips 110 and 120.

Figure 7:
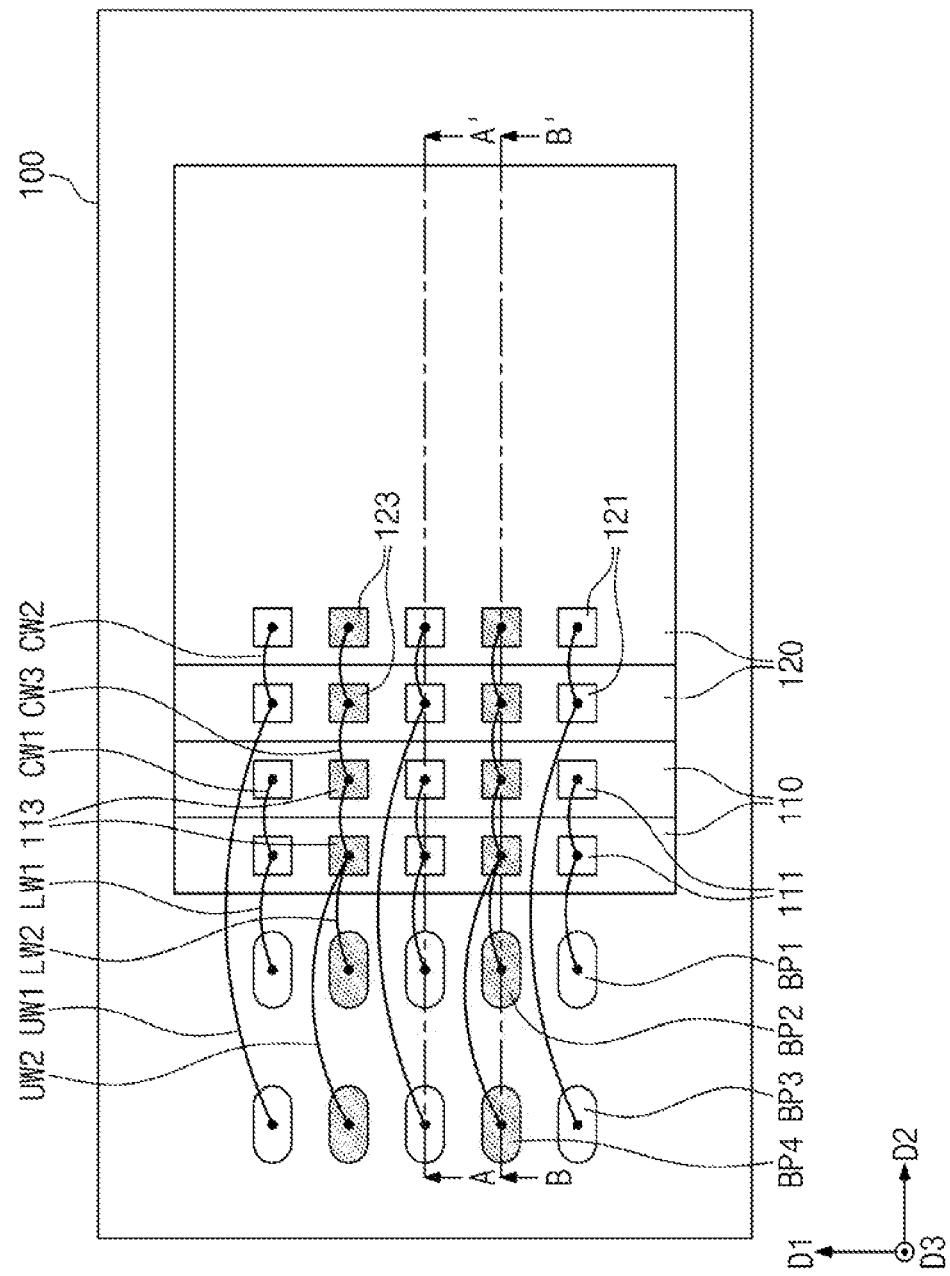
FIG. 7 illustrates a plan view of a semiconductor package according to some embodiments.

FIG. 7 illustrates a plan view of a semiconductor package according to some embodiments. FIGS. 8A and 8B illustrate cross-sectional views taken along lines A-A' and B-B' of FIG. 7.

Referring to FIGS. 7, 8A, and 8B, the first upper wires UW1 may connect the second signal pads 121 of the lowermost second chip 120 of the second chip stack CS2 to the third bonding pads BP3 of the package substrate 100.

The second upper wires UW2 may connect the first power/ground pads 113 of the lowermost first chip 110 of the first chip stack CS1 to the fourth bonding pads BP4 of the package substrate 100. The second upper wires UW2 may pass over the first lower wires LW1 and may connect with the fourth bonding pads BP4. The second upper wires UW2 may have a length different from that of the first upper wires UW1, e.g., the length of the second upper wires UW2 may be less than that of the first upper wires UW1.

According to the present embodiment, the chip stack CS1 may be configured such that three bonding wires may be bonded to each of the first power/ground pads 113 of the lowermost first chip 110.

In an implementation, as illustrated in the drawings, the second upper wires UW2 may be connected to the first power/ground pads 113 of the lowermost first chip 110, or the second upper wires UW2 may be connected to either one of the first chips 110 of the first chip stack CS1 or one of the second chips 120 of the second chip stack CS2.

The first upper wires UW1 may be connected to the lowermost second chip 120, and the second upper wires UW2 may be connected to the uppermost second chip 120. In this case, the second upper wires UW2 may be longer than the first upper wires UW1.

Figure 9:
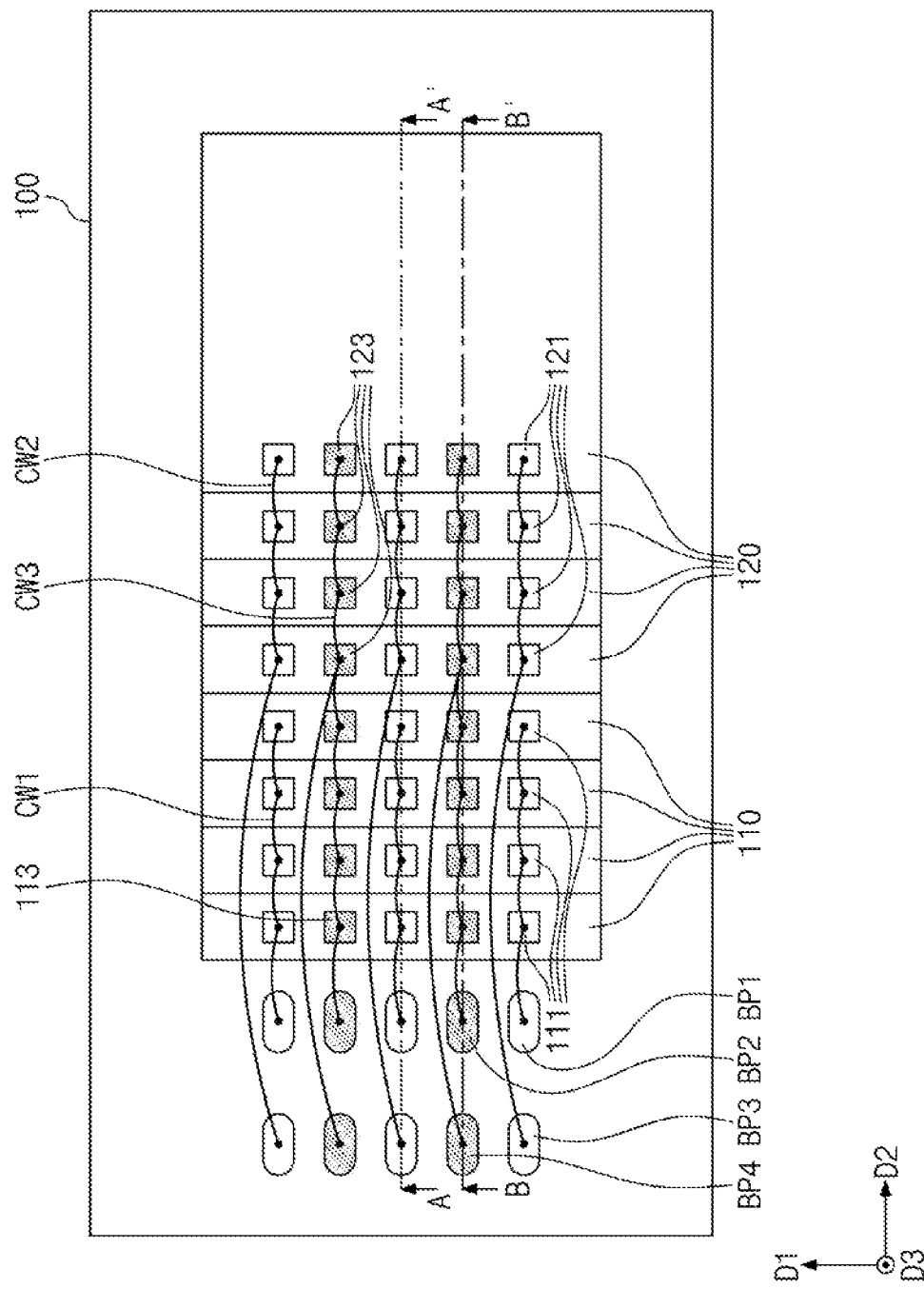
FIG. 9 illustrates a plan view of a semiconductor package according to some embodiments.
Figure 10A:
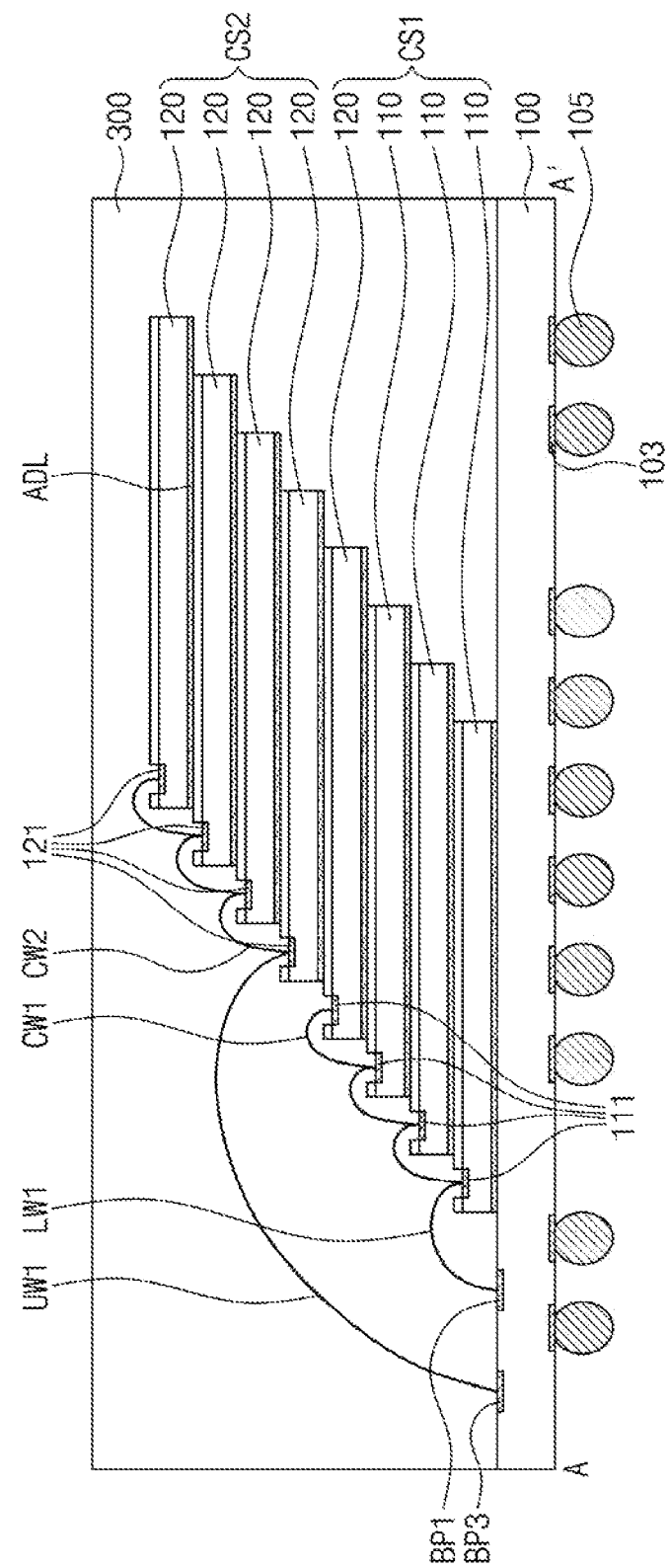
FIGS. 10A and 10B illustrate cross-sectional views taken along lines A-A' and B-B' of FIG. 9.
Figure 10B:
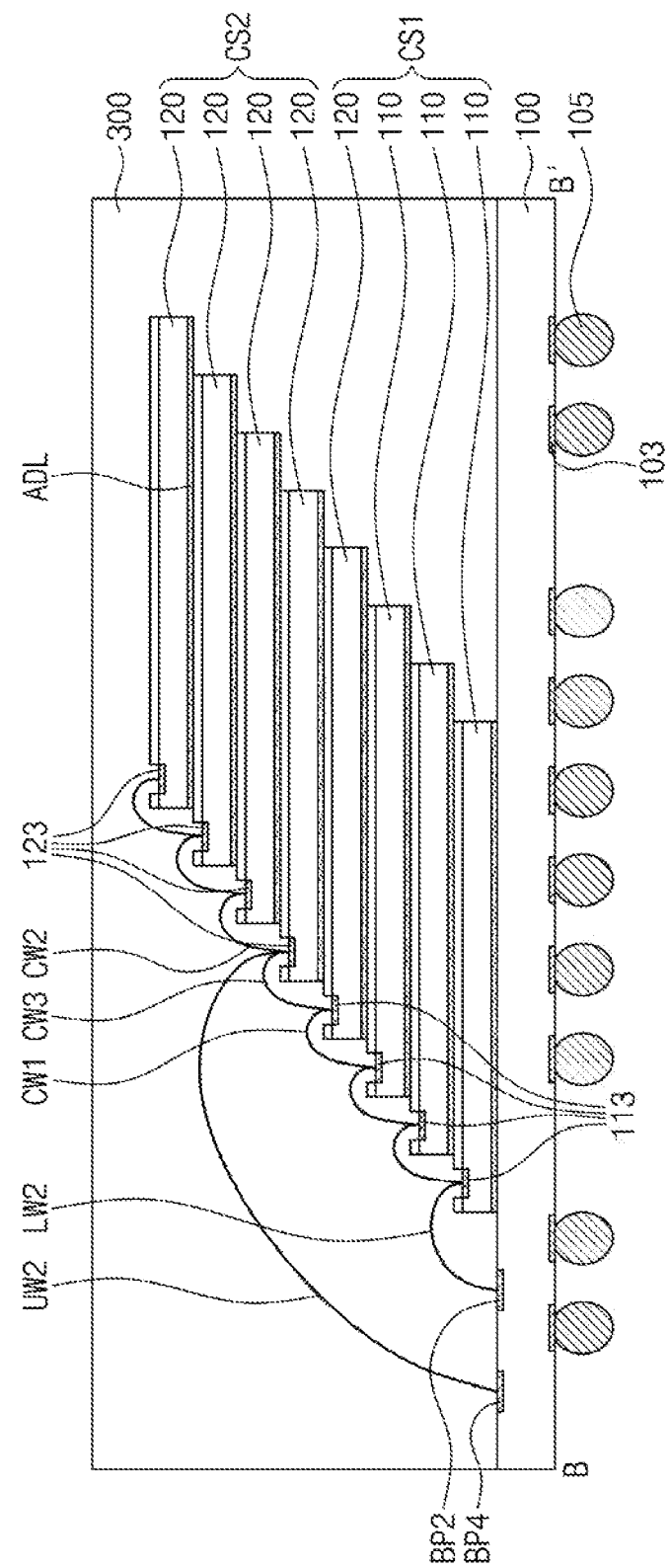

FIG. 9 illustrates a plan view of a semiconductor package according to some embodiments. FIGS. 10A and 10B illustrate cross-sectional views taken along lines A-A' and B-B' of FIG. 9.

Referring to FIGS. 9, 10A, and 10B, the first chip stack CS1 may include four first chips 110 that are stacked through one or more adhesion layers ADL on the package substrate 100. The second chip stack CS2 may include four second chips 120 that are stacked one or more adhesion layers ADL on the first chip stack CS1.

In an implementation, the number of stacked first chips 110 may be six, eight, sixteen, or the like. In an implementation, the number of stacked second chips 120 may be six, eight, sixteen, or the like. In an implementation, the number of stacked first chips 110 may be different from that of stacked second chips 120.

As discussed above, the first connection wires CW1 may connect the first chips 110 to each other, and the second connection wires CW2 may connect the second chips 120 to each other.

The third connection wires CW3 may connect the first power/ground pads 113 of the uppermost first chip 110 to the second power/ground pads 123 of the lowermost second chip 120.

The first upper wires UW1 may connect the second signal pads 121 of one of the second chips 120 to the third bonding pads BP3 of the package substrate 100. In an implementation, the first upper wires UW1 may be connected to the second signal pads 121 of the lowermost second chip 120.

The second upper wires UW2 may connect the second power/ground pads 123 of one of the second chips 120 to the fourth bonding pads BP4 of the package substrate 100.

The second upper wires UW2 may have a length substantially the same as that of the first upper wires UW1. In an implementation, the second upper wires UW2 may have a length different from that of the first upper wires UW1. In an implementation, the first upper wires UW1 may be connected to the lowermost second chip 120, and the second upper wires UW2 may be connected to another second chip 120 other than the lowermost second chip 120.

Figure 11A:
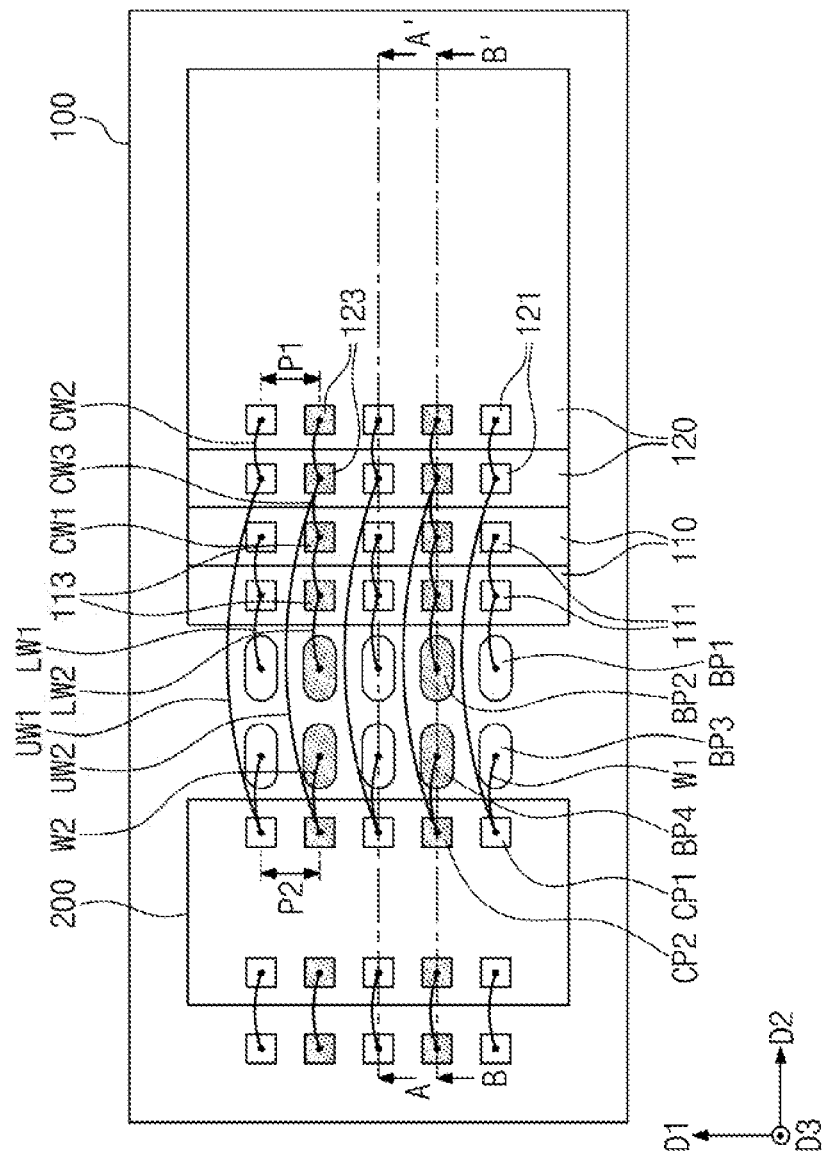
FIGS. 11A and 11B illustrate plan views of a semiconductor package according to some embodiments.
Figure 11B:
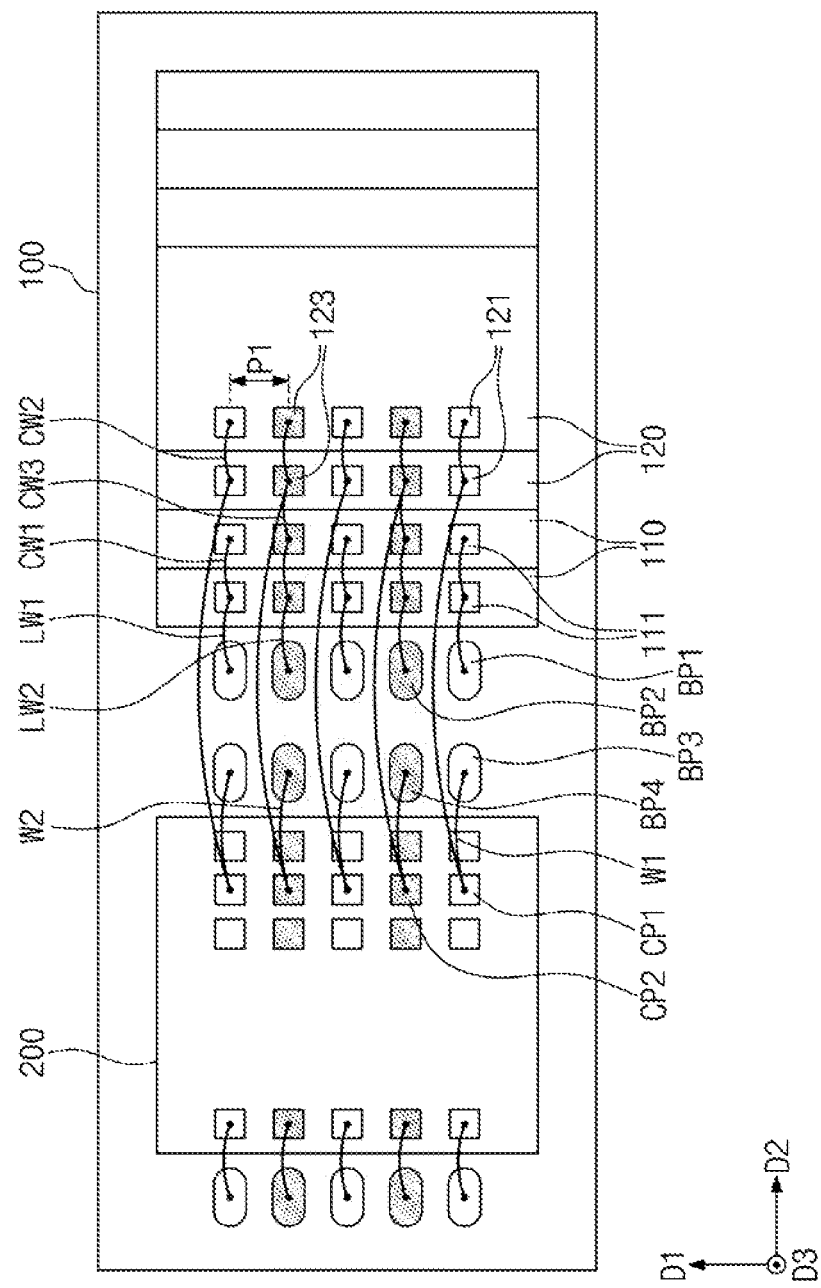
Figure 12A:
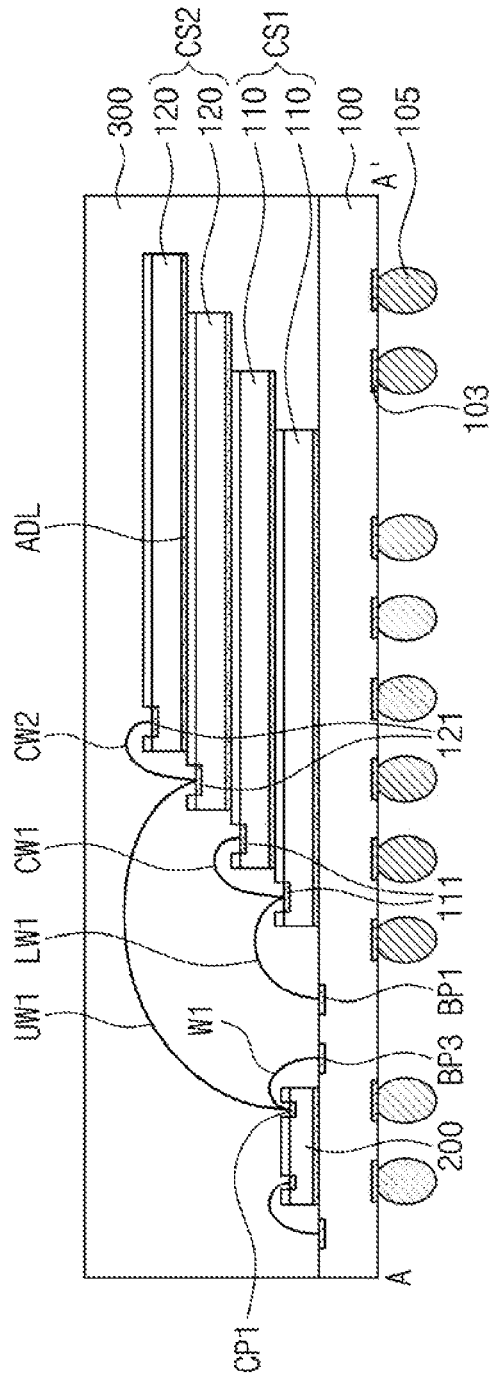
FIGS. 12A and 12B illustrate cross-sectional views taken along lines A-A' and B-B' of FIG. 11A.
Figure 12B:
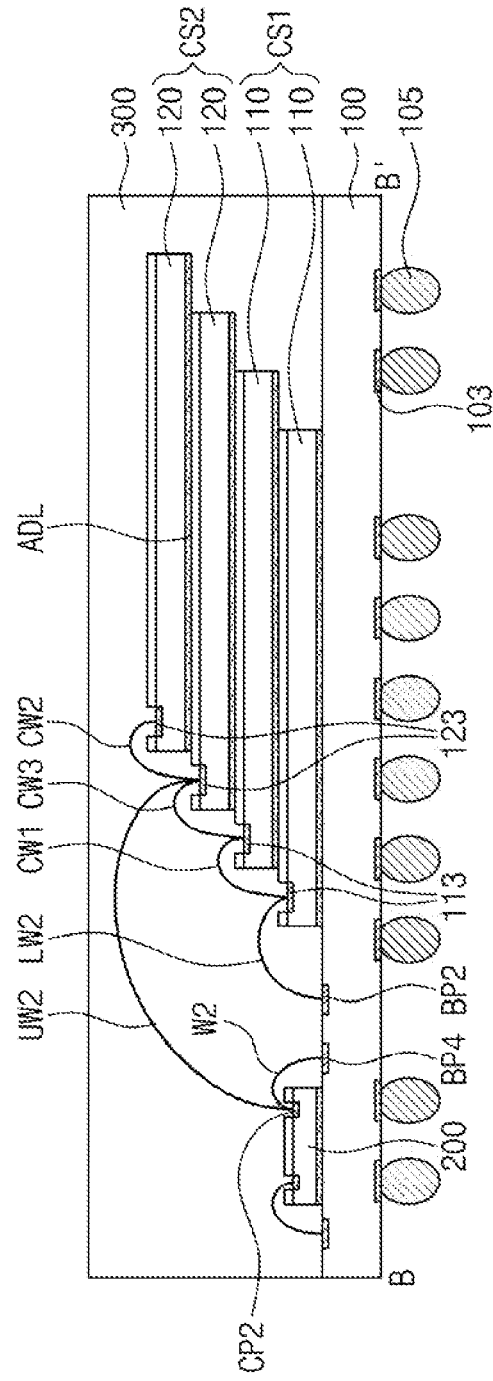

FIGS. 11A and 11B illustrate plan views of a semiconductor package according to some embodiments. FIGS. 12A and 12B illustrate cross-sectional views taken along lines A-A' and B-B' of FIG. 11A.

Referring to FIGS. 11A, 12A, and 12B, a semiconductor package according to the present embodiment may include a package substrate 100, a first chip stack CS1, a second chip stack CS2 on the first chip stack CS1, a controller chip 200, first and second upper wires UW1 and UW2, first and second lower wires LW1 and LW2, first, second, and third connection wires CW1, CW2, and CW3, and a molding layer 300.

The package substrate 100, as discussed above, may include first and second bonding pads BP1 and BP2 that are alternately arranged along the first direction D1, third bonding pads BP3 that are spaced apart in the second direction D2 from the first bonding pads BP1, and fourth bonding pads BP4 that are spaced apart in the second direction D2 from the second bonding pads BP2. In this case, the first and second bonding pads BP1 and BP2 may be adjacent to the first chip stack CS1, and the third and fourth bonding pads BP3 and BP4 may be adjacent to the controller chip 200.

The controller chip 200 may include chip pads that are arranged on or near an edge of the controller chip 200. The chip pads of the controller chip 200 may be arranged along the first direction D1 at a second pitch P2. The second pitch P2 may be substantially the same as a first pitch P1 of chip pads for each of the first and second chips 110 and 120.

The chip pads of the controller chip 200 may include first and second chip pads CP1 and CP2. The first and second chip pads CP1 and CP2 may be alternately arranged along the first direction D1. The first chip pads CP1 of the controller chip 200 may input and output a plurality of control signals or data signals, and the second chip pads CP2 may be provided with power or ground signals.

The controller chip 200 may include, e.g., a central processing unit (CPU), an internal memory, a buffer memory control unit, a host interface, and a flash interface.

In an implementation, a buffer memory chip may replace the controller chip 200, and the buffer memory chip may be a volatile memory chip. In an implementation, the buffer memory chip may be a dynamic random access memory (DRAM) chip.

In an implementation, the first upper wires UW1 may connect the second signal pads 121 of one of the second chips 120 to the first chip pads CP1 of the controller chip 200. The second upper wires UW2 may connect the second power/ground pads 123 of one of the second chips 120 to the second chip pads CP2 of the controller chip 200.

The first lower wires LW1 may connect the first signal pads 111 of one of the first chips 110 to the first bonding pads BP1 of the package substrate 100. The second lower wires LW2 may connect the first power/ground pads 113 of one of the first chips 110 to the second bonding pads BP2 of the package substrate 100.

The first chip pads CP1 of the controller chip 200 may be connected through first bonding wires W1 to the third bonding pads BP3 of the package substrate 100. The second chip pads CP2 of the controller chip 200 may be connected through second bonding wires W2 to the fourth bonding pads BP4 of the package substrate 100.

According to the embodiment shown in FIG. 11B, the controller chip 200 may be configured such that chip pads arranged along the first direction D1 may constitute one column, and that chip pads may constitute three columns adjacent to an edge of the controller chip 200.

In an implementation, the controller chip 200 may include first, second, and third columns that are sequentially disposed along the second direction D2, and chip pads that constitute the second column may include first and second chip pads CP1 and CP2. The first and second chip pads CP1 and CP2 may be alternately arranged along the first direction D1. As discussed above, the first chip pads CP1 may input and output a plurality of control signals or data signals, and the second chip pads CP2 may be provided with power or ground signals.

In an implementation, the first upper wires UW1 may connect the second signal pads 121 of one of the second chips 120 to the first chip pads CP1 in the second column of the controller chip 200. The second upper wires UW2 may connect the second power/ground pads 123 of one of the second chips 120 to the second chip pads CP2 in the second column of the controller chip 200.

The first chip pads CP1 in the second column of the controller chip 200 may be connected through the first bonding wires W1 to the third bonding pads BP3 of the package substrate 100. The second chip pads CP2 in the second column of the controller chip 200 may be connected through the second bonding wires W2 to the fourth bonding pads BP4 of the package substrate 100.

Figure 13:
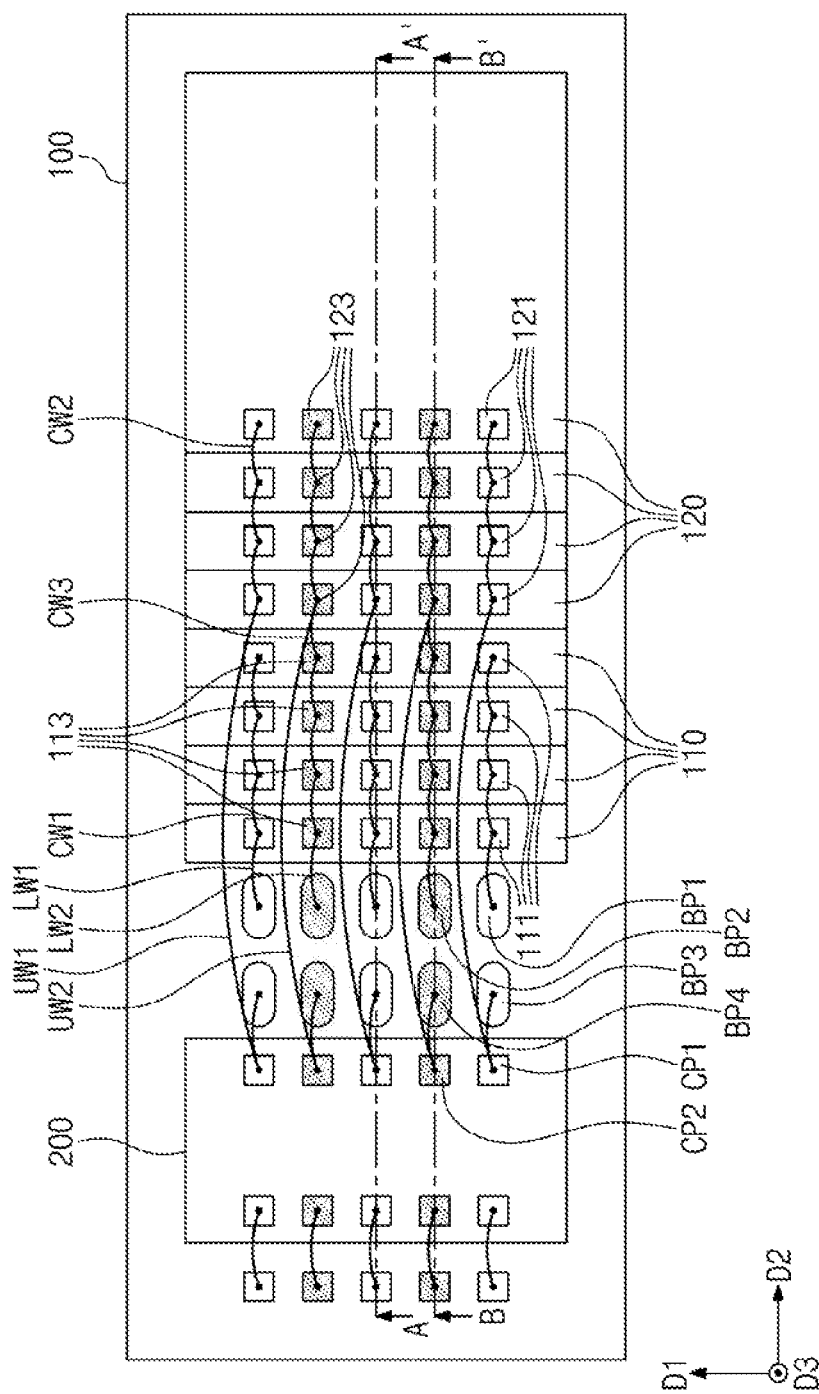
FIG. 13 illustrates a plan view of a semiconductor package according to some embodiments.
Figure 14A:
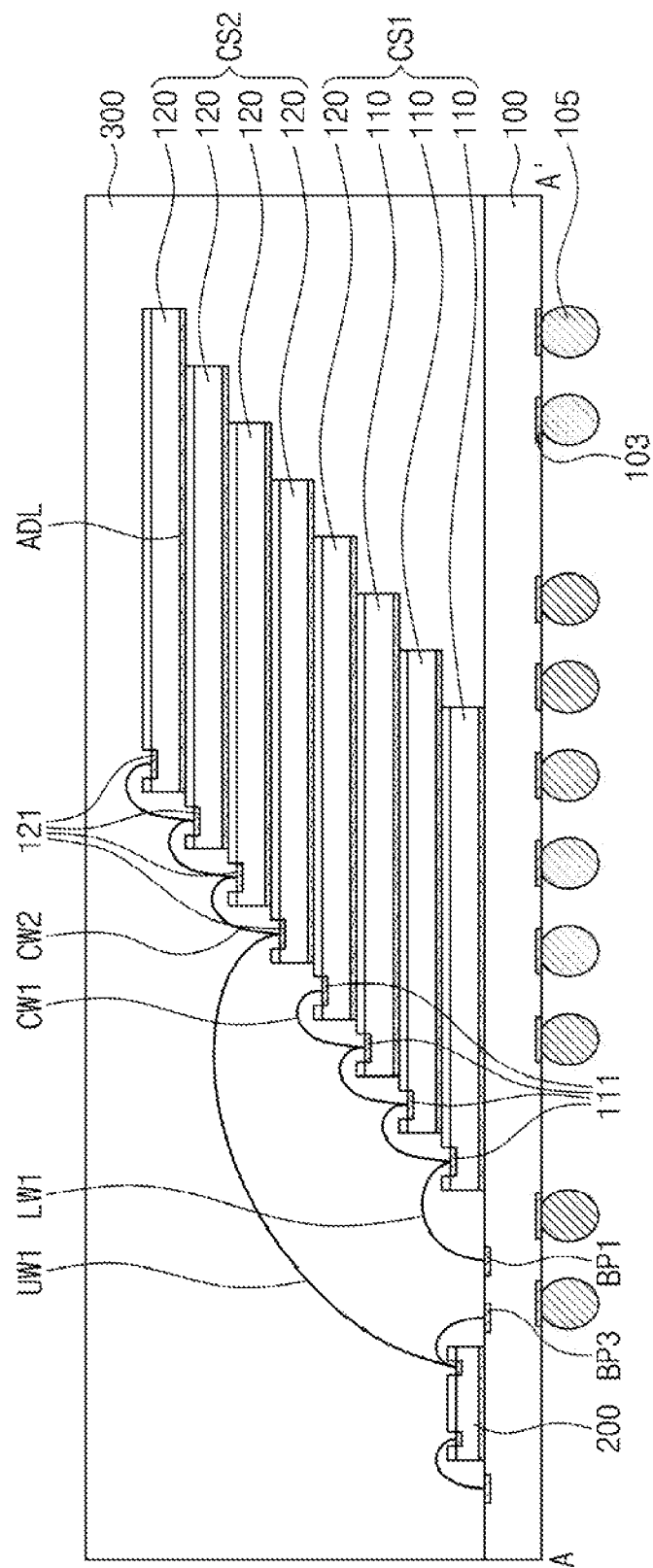
FIGS. 14A and 14B illustrate cross-sectional views taken along lines A-A' and B-B' of FIG. 13.
Figure 14B:
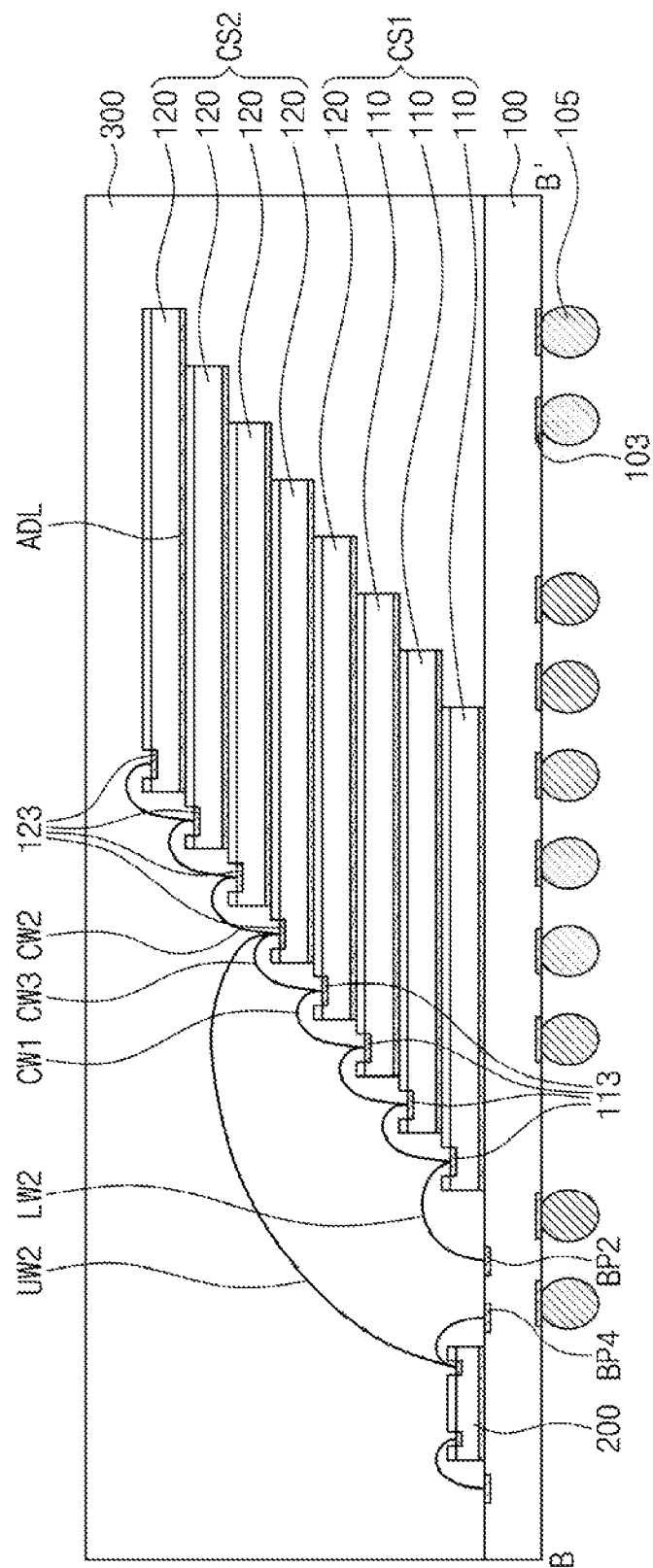

FIG. 13 illustrates a plan view of a semiconductor package according to some embodiments. FIGS. 14A and 14B illustrate cross-sectional views taken along lines A-A' and B-B' of FIG. 13.

Different from the embodiment shown in FIGS. 11A, 12A, and 12B, a semiconductor package according to the present embodiment shown in FIGS. 13, 14A, and 14B may be configured such that the first chip stack CS1 may include four first chips 110 that are stacked through one or more adhesion layers ADL on the package substrate 100. The second chip stack CS2 may include four second chips 120 that are stacked through one or more adhesion layers ADL on the first chip stack CS1.

In an implementation, the number of stacked first chips 110 may be six, eight, sixteen, or the like. In an implementation, the number of stacked second chips 120 may be six, eight, sixteen, or the like. In an implementation, the number of stacked first chips 110 may be different from that of stacked second chips 120.

The first upper wires UW1 may connect the second signal pads 121 of the lowermost second chip 120 to the first chip pads CP1 of the controller chip 200. The second upper wires UW2 may connect the second power/ground pads 123 of the lowermost second chip 120 to the second chip pads CP2 of the controller chip 200.

The second upper wires UW2 may have a length substantially the same as that of the first upper wires UW1. In an implementation, the second upper wires UW2 may have a length different from that of the first upper wires UW1. In an implementation, the first upper wires UW1 may be connected to the lowermost second chip 120, and the second upper wires UW2 may be connected to another second chip 120 other than the lowermost second chip 120.

Figure 15:
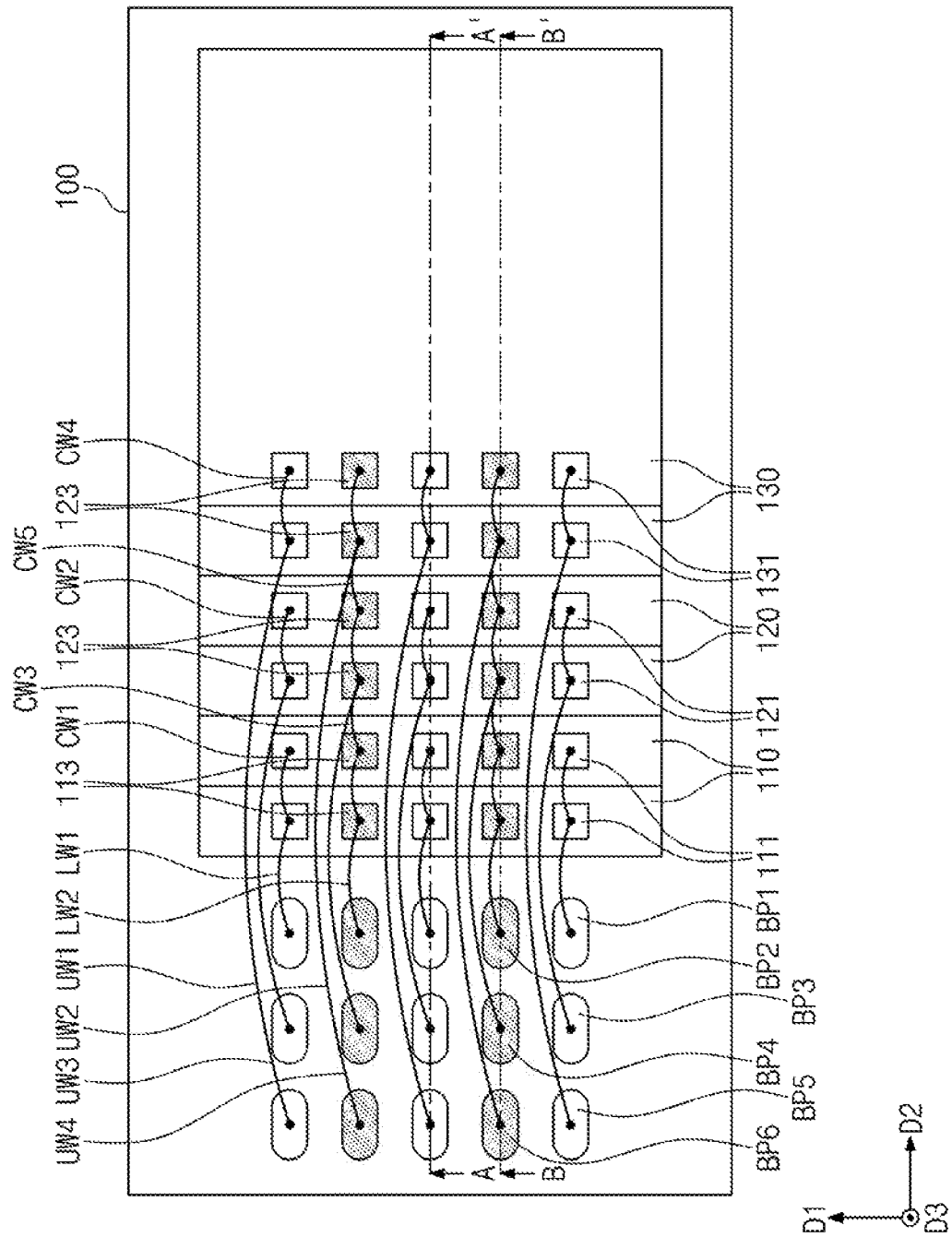
FIG. 15 illustrates a plan view of a semiconductor package according to some embodiments.
Figure 16A:
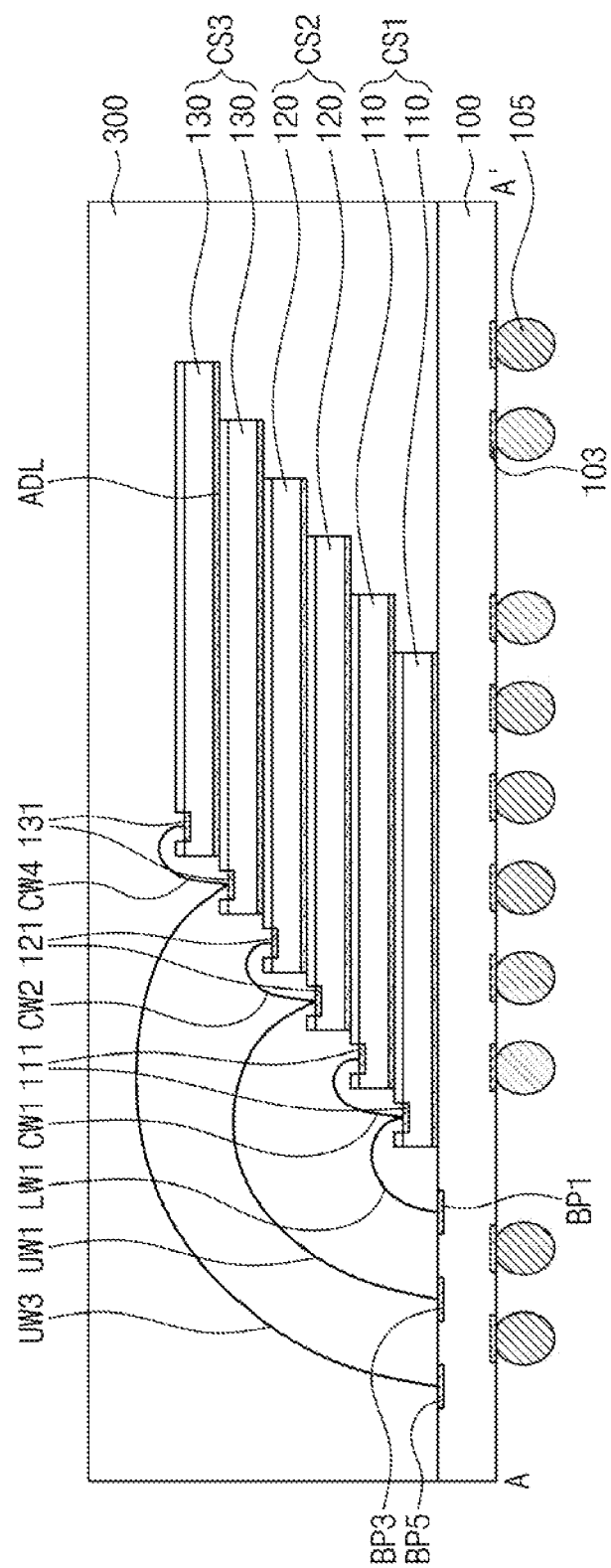
FIGS. 16A and 16B illustrate cross-sectional views taken along lines A-A' and B-B' of FIG. 15.
Figure 16B:
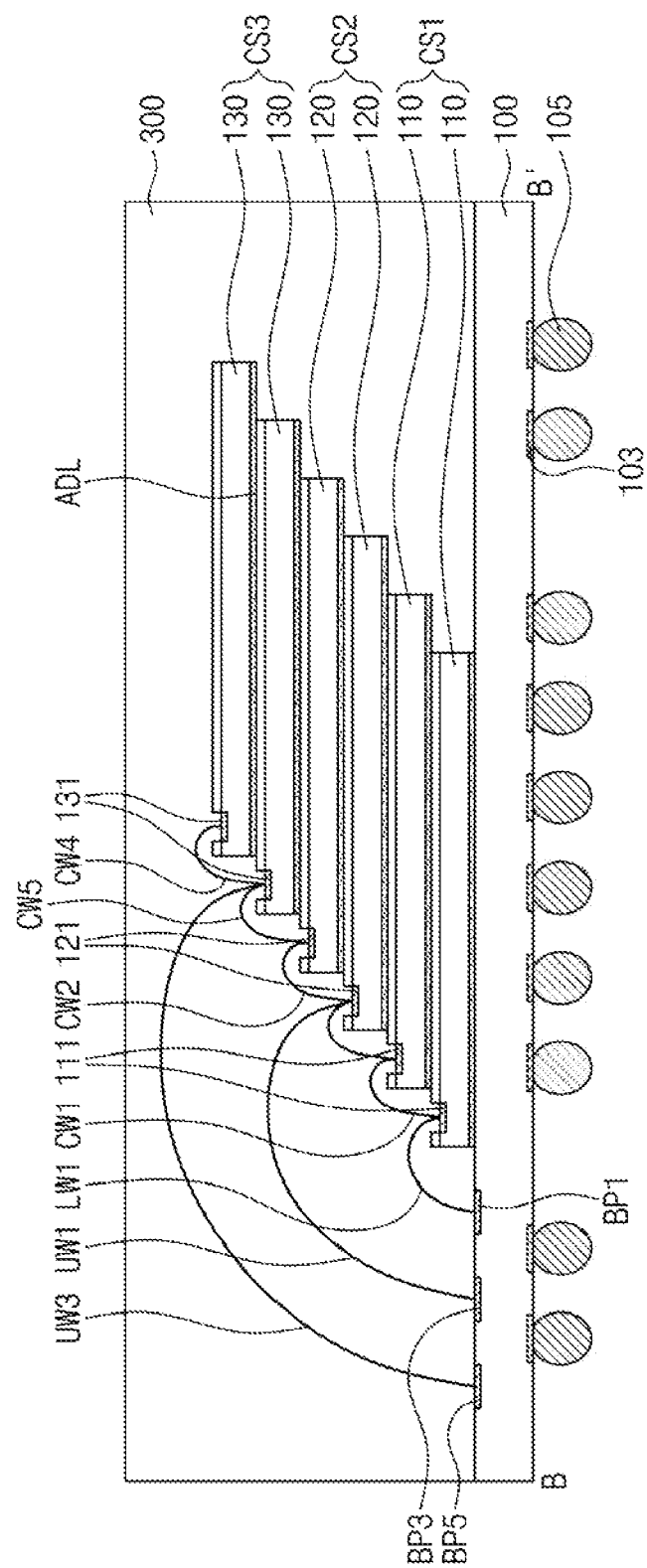

FIG. 15 illustrates a plan view of a semiconductor package according to some embodiments. FIGS. 16A and 16B illustrate cross-sectional views taken along lines A-A' and B-B' of FIG. 15.

Referring to FIGS. 15, 16A, and 16B, a semiconductor package according to the present embodiment may include a package substrate 100, a first chip stack CS1, a second chip stack CS2 on the first chip stack CS1, a third chip stack CS3 on the second chip stack CS2, first and second lower wires LW1 and LW2, first to fourth upper wires UW1 to UW4, first to fifth connection wires CW1 to CW5, and a molding layer 300.

The package substrate 100 may include first and second bonding pads BP1 and BP2 that are alternately arranged along the first direction D1, third bonding pads BP3 spaced apart from the first bonding pads BP1 in the second direction D2, fourth bonding pads BP4 spaced apart in the second direction D2 from the second bonding pads BP2, fifth bonding pads BP5 spaced apart in the second direction D2 from the third bonding pads BP3, and sixth bonding pads BP6 spaced apart in the second direction D2 from the fourth bonding pads BP4. The first and second bonding pads BP1 and BP2 may be closer to the first chip stack CS1 than the third and fourth bonding pads BP3 and BP4 are to the first chip stack CS1. The third and fourth bonding pads BP3 and BP4 may be closer to the first chip stack CS1 than the fifth and sixth bonding pads BP5 and BP6 are to the first chip stack CS1.

The first, third, and fifth bonding pads BP1, BP3, and BP5 may have intervals in the second direction D2 that are substantially the same as each other, and the second, fourth, and sixth bonding pads BP2, BP4, and BP6 may have intervals in the second direction D2 that are substantially the same as each other.

Each of the first, second, and third chips 110, 120, and 130 may have a structure in which chip pads are arranged on or near an edge thereof. The first, second, and third chips 110, 120, and 130 may be stacked along the second direction D2 to constitute a staircase or cascade structure.

As discussed above, the first chips 110 of the first chip stack CS1 may each include first signal pads 111 and first power/ground pads 113. The second chips 120 of the second chip stack CS2 may each include second signal pads 121 and second power/ground pads 123.

The third chip stack CS3 may include a plurality of third chips 130 that are stacked through one or more adhesion layers ADL on the second chip stack CS2. In an implementation, two third chips 130 may be stacked, or the number of stacked third chips 130 may be, e.g., four, six, eight, or the like. Each of the third chips 130 of the third chip stack CS3 may include third signal pads 131 and third power/ground pads 133 that are alternately arranged along the first direction D1.

The first, second, and third chip stacks CS1, CS2, and CS3 may output a plurality of input/output signals through different channels. The first, second, and third power/ground pads 113, 123, and 133 of the first, second, and third chips 110, 120, and 130 may be electrically connected to each other.

As discussed above, the first connection wires CW1 may connect the first chips 110 to each other, and the second connection wires CW2 may connect the second chips 120 to each other. The third connection wires CW3 may connect the first power/ground pads 113 of the uppermost first chip 110 to the second power/ground pads 123 of the lowermost second chip 120.

The fourth connection wires CW4 may connect the third signal pads 131 of the third chips 130 to each other, and the fifth connection wires CW5 may connect the third power/ground pads 133 of a lowermost one of the third chips 130 to the second power/ground pads 123 of the uppermost one of the second chips 120.

In addition, as discussed above, the first upper wires UW1 may connect the second signal pads 121 of one of the second chips 120 to the third bonding pads BP3 of the package substrate 100. The second upper wires UW2 may connect the second power/ground pads 123 of one of the second chips 120 to the fourth bonding pads BP4 of the package substrate 100.

The third upper wires UW3 may connect the third signal pads 131 of one of the third chips 130 to the fifth bonding pads BP5 of the package substrate 100. The fourth upper wires UW4 may connect the third power/ground pads 133 of one of the third chips 130 to the sixth bonding pads BP6 of the package substrate 100.

The fourth upper wires UW4 may have a length substantially the same as that of the third upper wires UW3. In an implementation, the fourth upper wires UW4 may have a length different from that of the third upper wires UW3. In an implementation, the third upper wires UW3 may be connected to the lowermost third chip 130, and the fourth upper wires UW4 may be connected to another third chip 130 other than the lowermost third chip 130.

Figure 17:
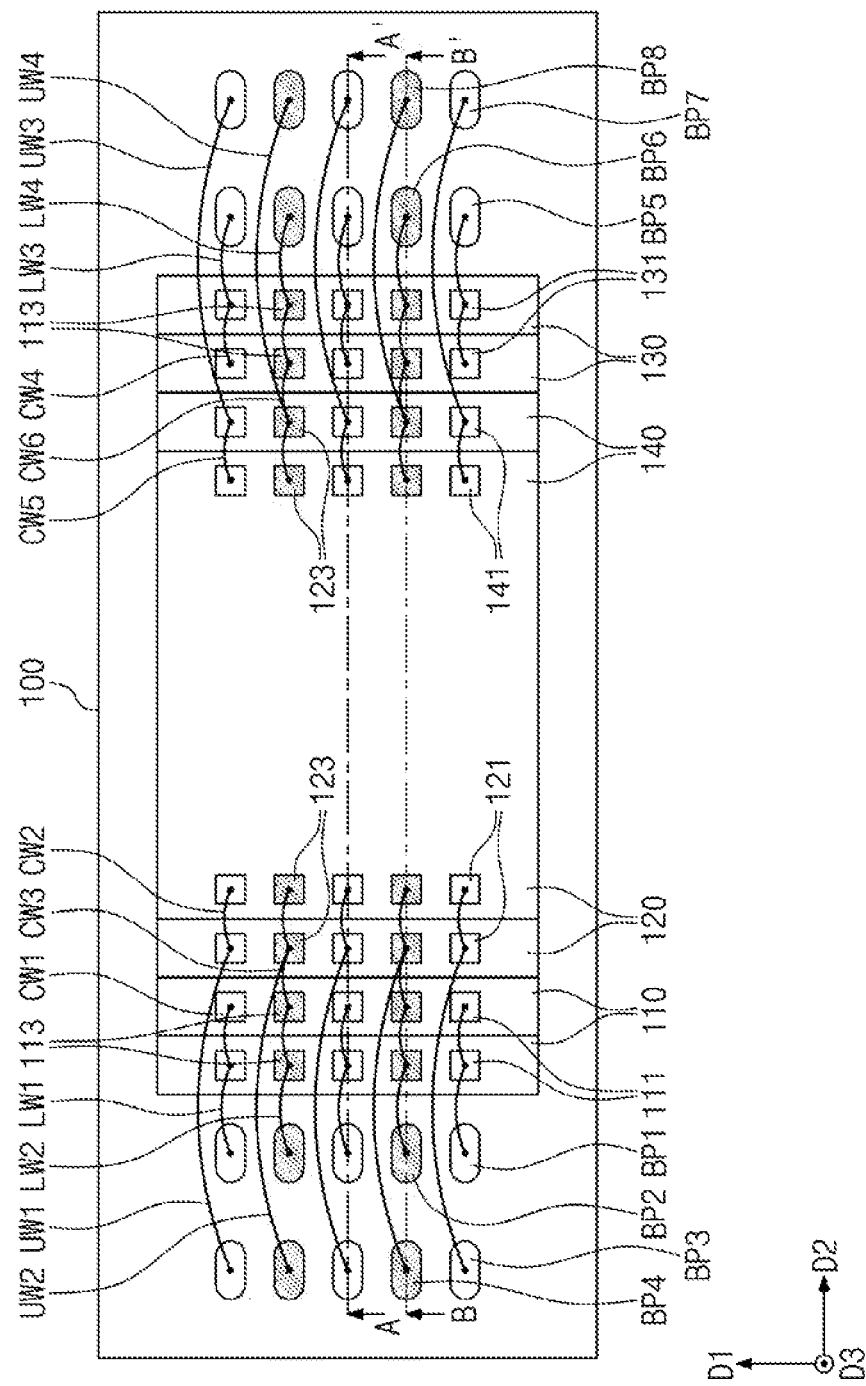
FIG. 17 illustrates a plan view of a semiconductor package according to some embodiments.
Figure 18A:
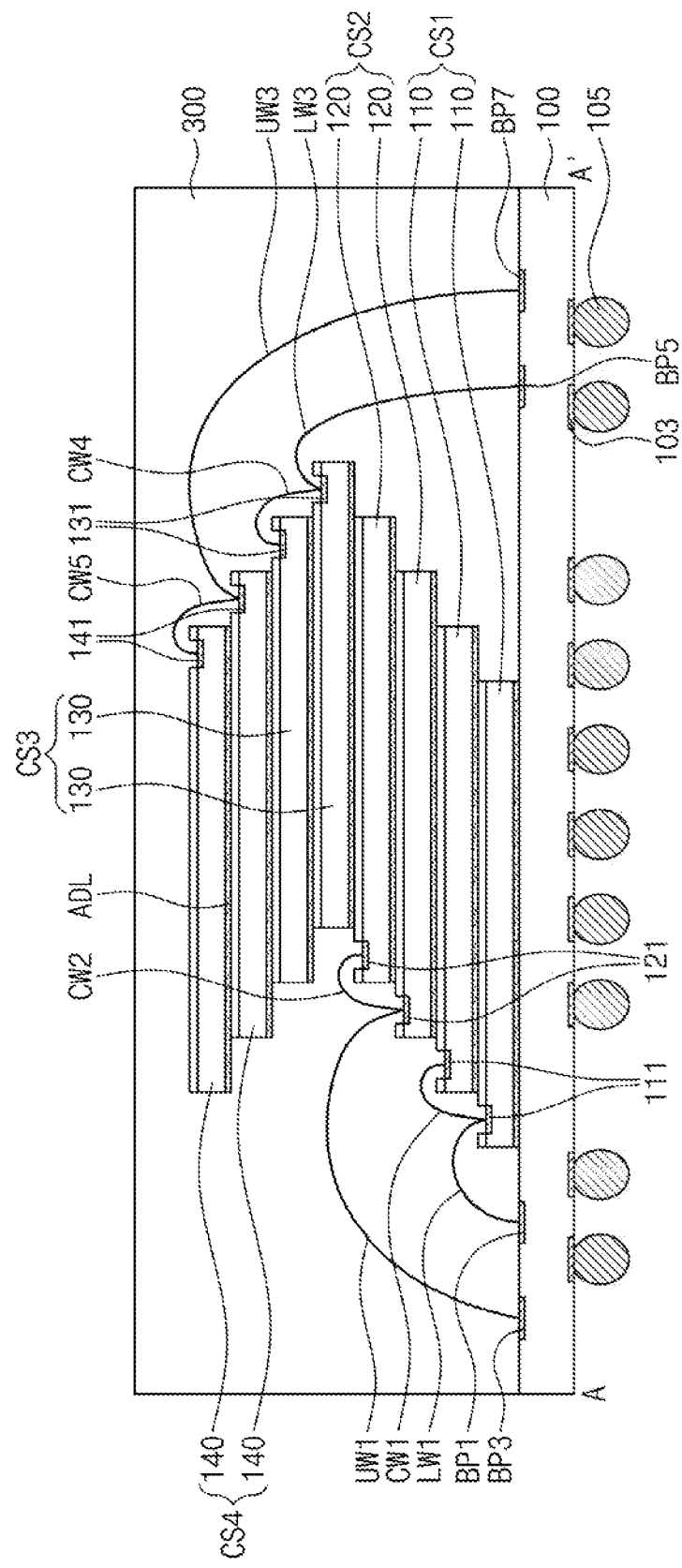
FIGS. 18A and 18B illustrate cross-sectional views taken along lines A-A' and B-B' of FIG. 17.
Figure 18B:
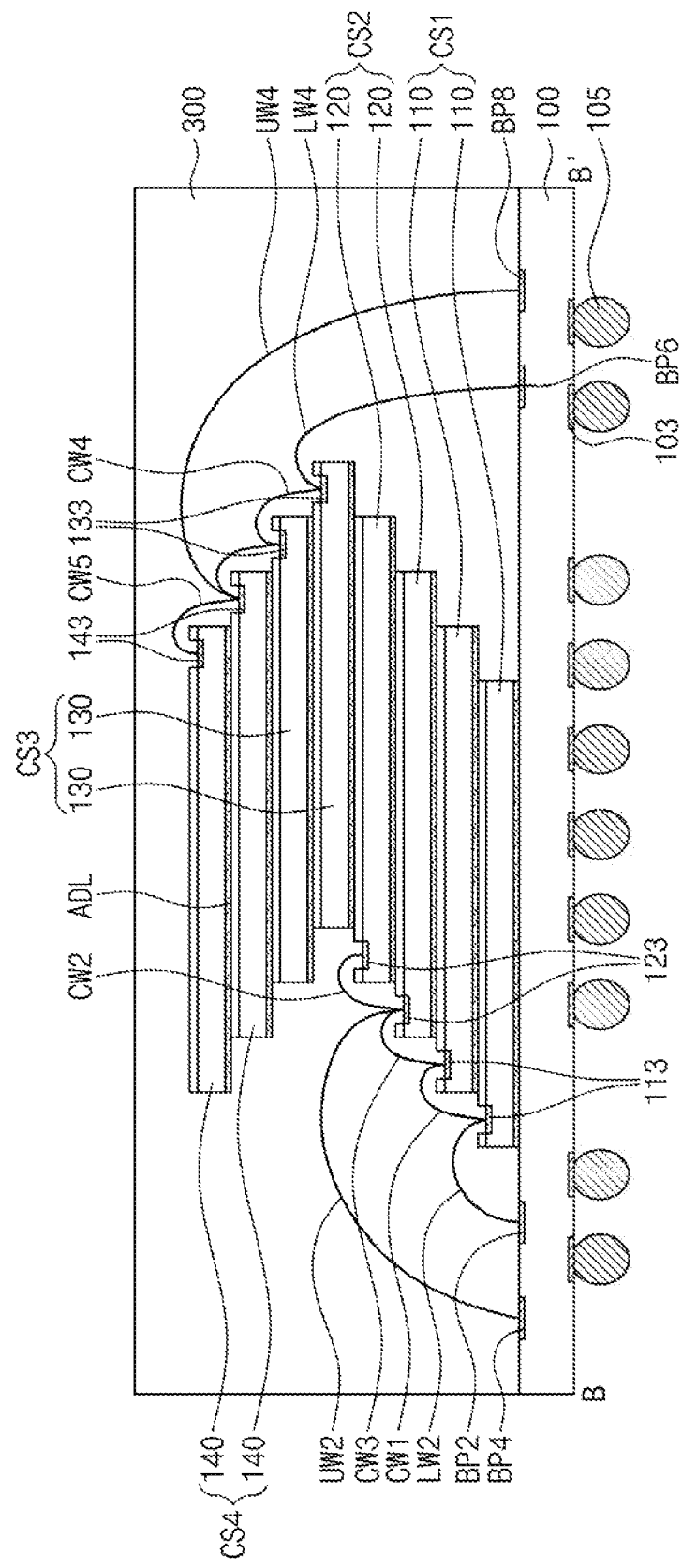

FIG. 17 illustrates a plan view of a semiconductor package according to some embodiments. FIGS. 18A and 18B illustrate cross-sectional views taken along lines A-A' and B-B' of FIG. 17.

According to the embodiment shown in FIGS. 17, 18A, and 18B, a semiconductor package may include a package substrate 100, a first chip stack CS1, a second chip stack CS2 on the first chip stack CS1, a third chip stack CS3 on the second chip stack CS2, a fourth chip stack CS4 on the third chip stack CS3, first to fourth lower wires LW1 to LW4, first to fourth upper wires UW1 to UW4, first to sixth connection wires CW1 to CW6, and a molding layer 300.

The package substrate 100, as discussed above, may include first to fourth bonding pads BP1 to BP4. In addition, the package substrate 100 may further include fifth to eighth bonding pads BP5 to BP8. The fifth and sixth bonding pads BP5 and BP6 may be alternately arranged along the first direction D1, the seventh bonding pads BP7 may be spaced apart in the second direction D2 from the fifth bonding pads BP5, and eighth bonding pads BP8 may be spaced apart in the second direction D2 from the sixth bonding pads BP6.

As discussed above, the first and second chip stacks CS1 and CS2 may respectively include a plurality of first chips 110 and a plurality of second chips 120.

The third chip stack CS3 may include a plurality of third chips 130 that are stacked through one or more adhesion layers ADL on the second chip stack CS2. In an implementation, two third chips 130 may be stacked, or the number of stacked third chips 130 may be, e.g., four, six, eight, or the like. Each of the third chips 130 of the third chip stack CS3 may include third signal pads 131 and third power/ground pads 133 that are alternately arranged along the first direction D1.

The fourth chip stack CS4 may include a plurality of fourth chips 140 that are stacked through one or more adhesion layers ADL on the third chip stack CS3. In an implementation, two fourth chips 140 may be stacked, or the number of stacked fourth chips 140 may be, e.g., four, six, eight, or the like. Each of the fourth chips 140 of the fourth chip stack CS4 may each include fourth signal pads 141 and fourth power/ground pads 143 that are alternately arranged along the first direction D1.

In an implementation, each of the first to fourth chips 110 to 140 may have a first edge and a second edge, each first and second chip 110 and 120 may include chip pads that are arranged adjacent to the first edge, and each third and fourth chip 130 and 140 may include chip pads that are arranged adjacent to the second edge.

The first chips 110 and the second chips 120 may be stepwise stacked along the second direction D2, and the third chips 130 and the fourth chips 140 may be stepwise stacked along a direction opposite to the stacking direction of the first chips 110 and second chips 120 (e.g., the first chips 110 and second chips 120 may form a staircase structure in one direction, and the third chips 130 and the fourth chips 140 may form a staircase structure in a direction opposite to the one direction).

The first and second bonding pads BP1 and BP2 may be arranged adjacent to the first chip stack CS1, and the fifth and sixth bonding pads BP5 and BP6 may be arranged adjacent to the third chip stack CS3.

The first to fourth chip stacks CS1 to CS4 may output a plurality of input/output signals through different channels. In an implementation, the fourth connection wires CW4 may electrically connect chip pads of the third chips 130 to each other. In an implementation, the third signal pads 131 of the third chips 130 may be connected to each other through the fourth connection wires CW4, and the third power/ground pads 133 of the third chips 130 may be connected to each other through the fourth connection wires CW4.

The fifth connection wires CW5 may electrically connect chip pads of the fourth chips 140 to each other. In an implementation, the fourth signal pads 141 of the fourth chips 140 may be connected to each other through the fifth connection wires CW5, and the fourth power/ground pads 143 of the fourth chips 140 may be connected to each other through the fifth connection wires CW5.

The third and fourth power/ground pads 133 and 143 of the third and fourth chips 130 and 140 may be electrically connected to each other through the sixth connection wires CW6.

The third lower wires LW3 may connect the third signal pads 131 of a lowermost third chip 130 of the third chip stack CS3 to the fifth bonding pads BP5 of the package substrate 100.

The fourth lower wires LW4 may connect the third power/ground pads 133 of the lowermost third chip 130 to the sixth bonding pads BP6 of the package substrate 100.

The third upper wires UW3 may connect the fourth signal pads 141 of a lowermost fourth chip 140 of the fourth chip stack CS4 to the seventh bonding pads BP7 of the package substrate 100. The third upper wires UW3 may pass over the fourth connection wires CW4 and the third lower wires LW3, thereby being bonded to the seventh bonding pads BP7. The third upper wires UW3 may be longer than the third lower wires LW3.

The fourth upper wires UW4 may connect the fourth power/ground pads 143 of the lowermost fourth chip 140 to the eighth bonding pads BP8 of the package substrate 100. The fourth upper wires UW4 may pass over the fourth connection wires CW4, the sixth connection wires CW6, and the fourth lower wires LW4, thereby being bonded to the eighth bonding pads BP8. The fourth upper wires UW4 may be longer than the fourth lower wires LW4. The fourth upper wires UW4 may have a length substantially the same as that of the third upper wires UW3. Each of the fourth upper wires UW4 may be between third upper wires UW3 that are adjacent to each other in the first direction D1.

Figure 19:
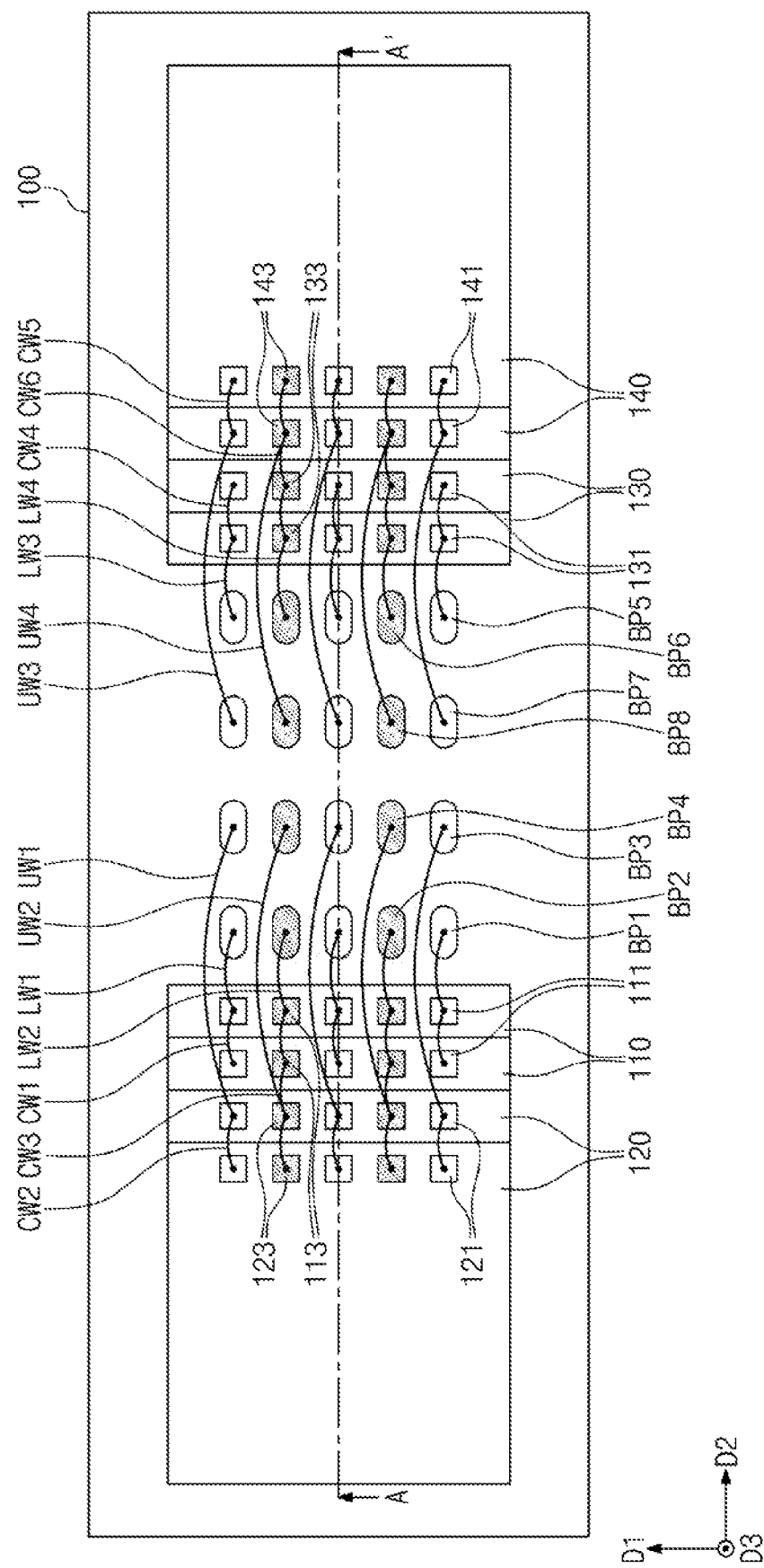
FIG. 19 illustrates a plan view of a semiconductor package according to some embodiments.
Figure 20:
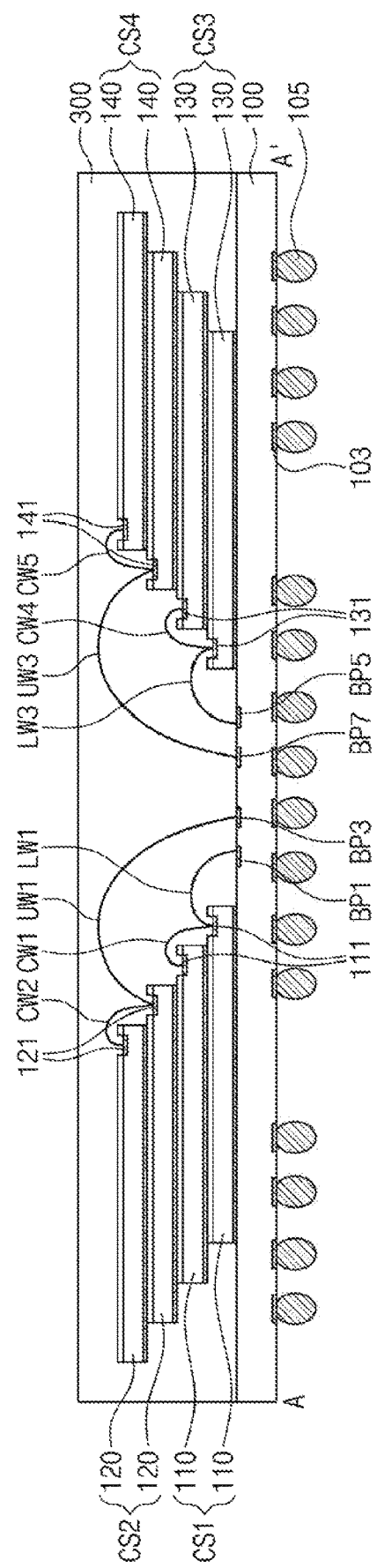
FIG. 20 illustrates a cross-sectional view taken along line A-A' of FIG. 19.

FIG. 19 illustrates a plan view of a semiconductor package according to some embodiments. FIG. 20 illustrates a cross-sectional view taken along line A-A' of FIG. 19.

Referring to FIGS. 19 and 20, a semiconductor package may include a package substrate 100, first to fourth chip stack CS1 to CS4, first to fourth lower wires LW1 to LW4, first to fourth upper wires UW1 to UW4, first to sixth connection wires CW1 to CW6, and a molding layer 300.

The package substrate 100 may include first to eighth bonding pads BP1 to BP8 that are provided in four columns along the second direction D2, and on each column, corresponding ones of the first to eighth bonding pads BP1 to BP8 may be arranged along the first direction D1.

The first chip stack CS1 may include a plurality of first chips 110 that are stacked through one or more adhesion layers ADL on the package substrate 100. The second chip stack CS2 may include a plurality of second chips 120 that are stacked through one or more adhesion layers ADL on the package substrate 100.

The package substrate 100 may be provided thereon with the third chip stack CS3 spaced apart in the second direction D2 from the first chip stack CS1. The third chip stack CS3 may include a plurality of third chips 130 that are stacked through one or more adhesion layers ADL on the package substrate 100. The fourth chip stack CS4 may include a plurality of fourth chips 140 that are stacked through one or more adhesion layers ADL on the package substrate 100.

The first and second bonding pads BP1 and BP2 of the package substrate 100 may be adjacent to the first chip stack CS1, and the fifth and sixth bonding pads BP5 and BP6 of the package substrate 100 may be adjacent to the third chip stack CS3.

In an implementation, each of the first to fourth chips 110 to 140 may have a first edge and a second edge, each first and second chip 110 and 120 may include chip pads that are arranged adjacent to the second edge, and each third and fourth chip 130 and 140 may include chip pads that are arranged adjacent to the first edge.

The first and second chips 110 and 120 may be stacked on the package substrate 100 in a direction opposite to the second direction D2, thereby constituting a staircase or cascade structure. The third and fourth chips 130 and 140 may be stepwise stacked along the second direction D2 (e.g., the staircase structure of the first and second chips 110 and 120 may extend in a direction opposite to the staircase structure of the third and fourth chips 130 and 140).

The first chips 110 may be stacked such that each of the first chips 110 may expose chip pads of its underlying first chip 110. The second chips 120 may be stacked such that each of the second chips 120 may expose chip pads of its underlying first chip 110 or its underlying second chip 120.

The third chips 130 may be stacked such that each of the third chips 130 may expose chip pads of its underlying third chip 130. The fourth chips 140 may be stacked such that each of the fourth chips 140 may expose chip pads of its underlying third chip 130 or its underlying fourth chip 140.

The first to fourth chips 110 and 140 may respectively include first to fourth signal pads 111 to 141 and first to fourth power/ground pads 113 to 143.

As discussed above, the first upper wires UW1 may connect the second signal pads 121 of one of the second chips 120 to the third bonding pads BP3, and the second upper wires UW2 may connect the second power/ground pads 123 of one of the second chips 120 to the fourth bonding pads BP4.

The third upper wires UW3 may connect the third signal pads 131 of one of the third chips 130 to the fifth bonding pads BP5, and the fourth lower wires LW4 may connect the third power/ground pads 133 of one of the third chips 130 to the sixth bonding pads BP6.

The third upper wires UW3 may connect the fourth signal pads 141 of one of the fourth chips 140 to the seventh bonding pads BP7, and the fourth upper wires UW4 may connect the fourth power/ground pads 143 of one of the fourth chips 140 to the eighth bonding pads BP8.

The third signal pads 131 of the third chips 130 may be connected to each other through the fourth connection wires CW4, and the fourth signal pads 141 of the fourth chips 140 may be connected to each other through the fifth connection wires CW5.

The third and fourth power/ground pads 133 and 143 of the third and fourth chips 130 and 140 may be electrically connected to each other through the sixth connection wires CW6.

Figure 21A:
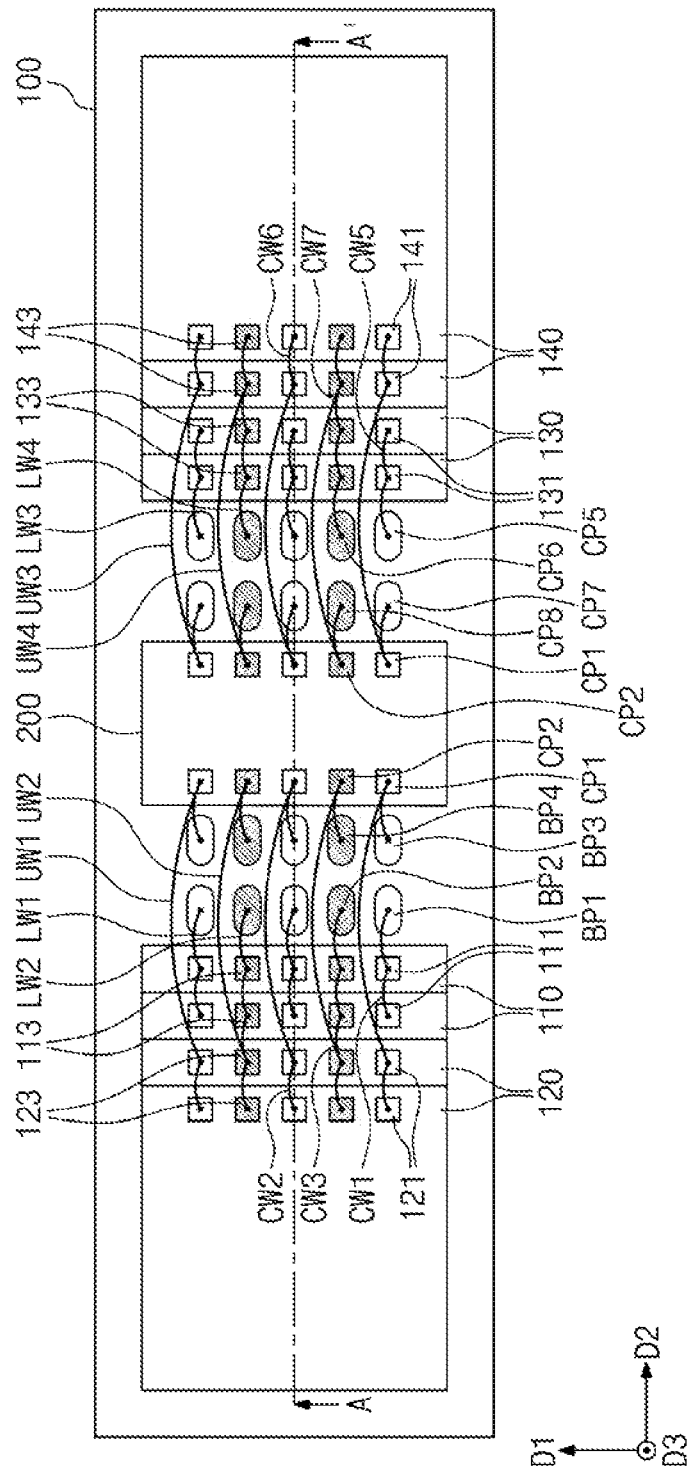
FIG. 21A illustrates a plan view of a semiconductor package according to some embodiments.
Figure 21B:
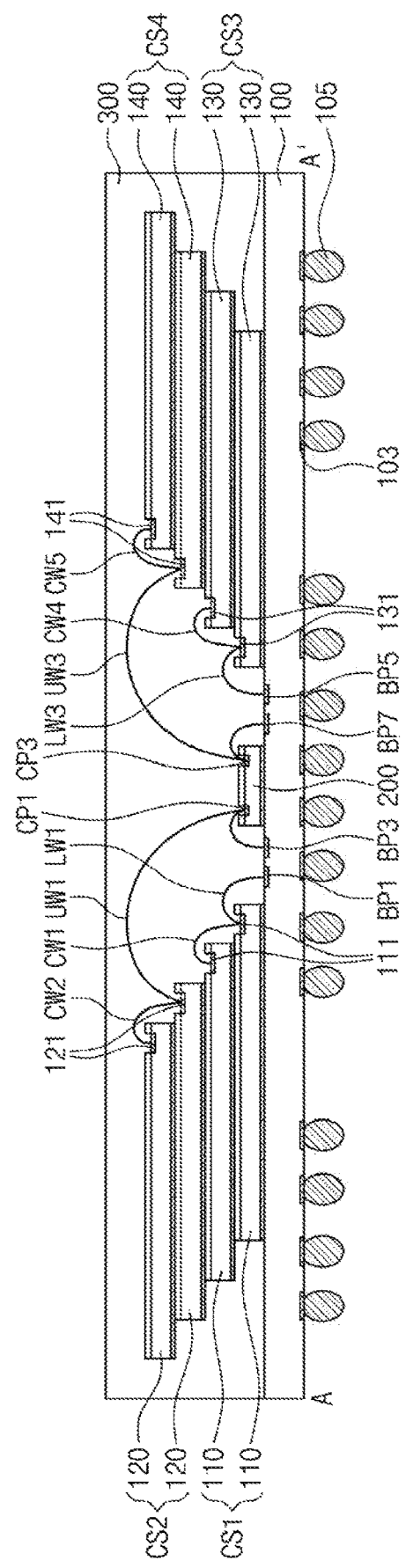
FIG. 21B illustrates a cross-sectional view taken along line A-A' of FIG. 21A.

FIG. 21A illustrates a plan view of a semiconductor package according to some embodiments. FIG. 21B illustrates a cross-sectional view taken along line A-A' of FIG. 21A.

According to the embodiment shown in FIGS. 21A and 21B, a semiconductor package may include a package substrate 100, first to fourth chip stacks CS1 to CS4, a controller chip 200, first to fourth lower wires LW1 to LW4, first to fourth upper wires UW1 to UW4, first to sixth connection wires CW1 to CW6, and a molding layer 300.

As discussed with reference to FIGS. 19 and 20, a stacking direction of the first and second chips 110 and 120 may be opposite to that of the third and fourth chips 130 and 140.

The controller chip 200 may have a first edge and a second edge that are opposite to each other, the first and second chip pads CP1 and CP2 may be adjacent to the first edge, and the third and fourth chip pads CP3 and CP4 may be adjacent to the second edge.

The package substrate 100 may include first to fourth bonding pads BP1 to BP4 that are between the first chip stack CS1 and the controller chip 200, and may also include fifth to eighth bonding pads BP5 to BP8 that are between the third chip stack CS3 and the controller chip 200.

In an implementation, the first upper wires UW1 may connect the second signal pads 121 of one of the second chips 120 to the first chip pads CP1 of the controller chip 200. The second upper wires UW2 may connect the second power/ground pads 123 of one of the second chips 120 to the second chip pads CP2 of the controller chip 200.

The third upper wires UW3 may connect the fourth signal pads 141 of one of the fourth chips 140 to the third chip pads CP3 of the controller chip 200. The fourth upper wires UW4 may connect the fourth power/ground pads 143 of one of the fourth chips 140 to the fourth chip pads CP4 of the controller chip 200.

Figure 22A:
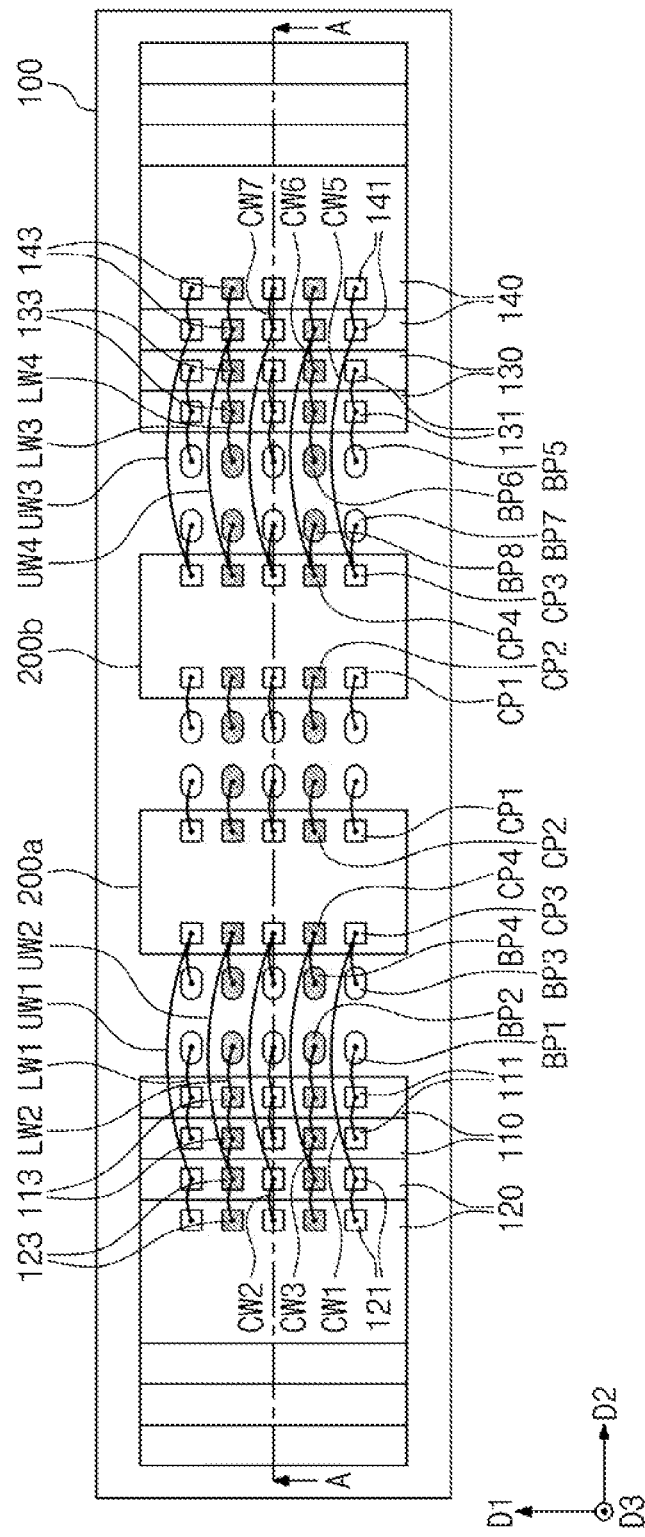
FIG. 22A illustrates a plan view of a semiconductor package according to some embodiments.
Figure 22B:
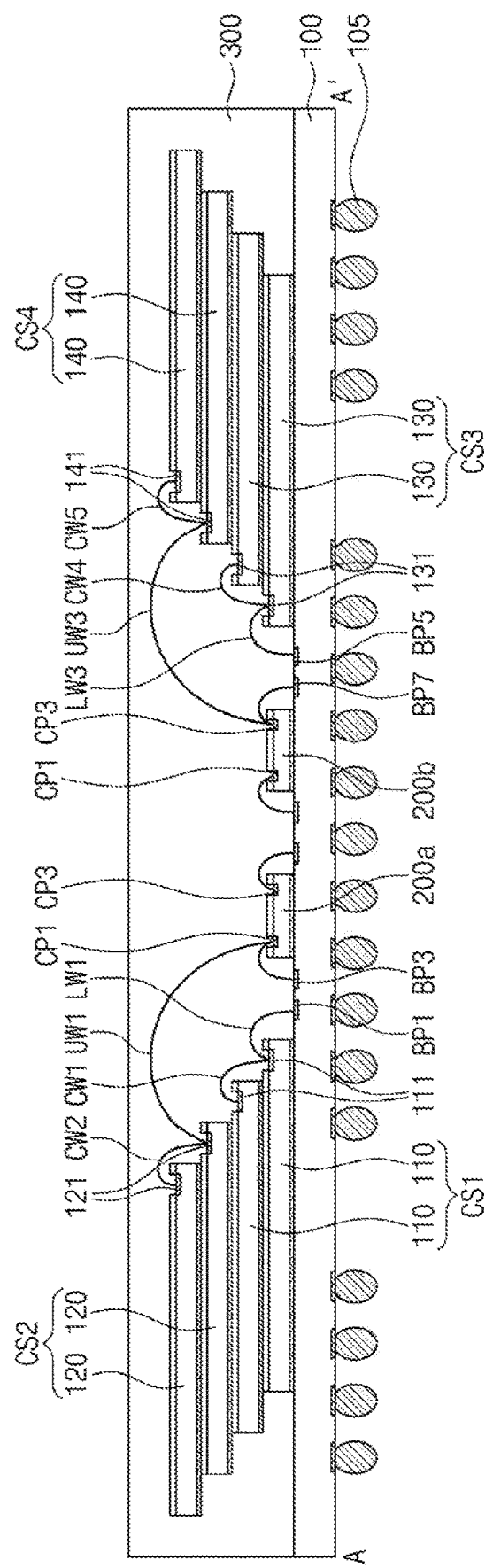
FIG. 22B illustrates a cross-sectional view taken along line A-A' of FIG. 22A.

FIG. 22A illustrates a plan view of a semiconductor package according to some embodiments. FIG. 22B illustrates a cross-sectional view taken along line A-A' of FIG. 22A.

According to the embodiment shown in FIGS. 22A and 22B, a semiconductor package may include a package substrate 100, first to fourth chip stacks CS1 to CS4, first and second controller chips 200a and 200b, first to fourth lower wires LW1 to LW4, first to fourth upper wires UW1 to UW4, first to sixth connection wires CW1 to CW6, and a molding layer 300.

The package substrate 100 may be provided thereon with the first controller chip 200a adjacent to the first and second chip stacks CS1 and CS2. The package substrate 100 may be provided thereon with the second controller chip 200b adjacent to the third and fourth chip stacks CS3 and CS4. In an implementation, the first and second controller chips 200a and 200b may be adjacent to each other.

Each of the first and second controller chips 200a and 200b may have a first edge and a second edge that are opposite to each other, the first and second chip pads CP1 and CP2 may be adjacent to the first edge, and the third and fourth chip pads CP3 and CP4 may be adjacent to the second edge.

The package substrate 100 may include first to fourth bonding pads BP1 to BP4 that are between the first chip stack CS1 and the first controller chip 200a, and may also include fifth to eighth bonding pads BP5 to BP8 that are between the third chip stack CS3 and the second controller chip 200b. In an implementation, the package substrate 100 may further include bonding pads between the first controller chip 200a and the second controller chip 200b.

The first upper wires UW1 may connect the second signal pads 121 of one of the second chips 120 to the third chip pads CP3 of the first controller chip 200a. The second upper wires UW2 may connect the second power/ground pads 123 of one of the second chips 120 to the fourth chip pads CP4 of the first controller chip 200a. The first and second chip pads CP1 and CP2 of the first controller chip 200a may be connected through wires to bonding pads of the package substrate 100.

The third upper wires UW3 may connect the fourth signal pads 141 of one of the fourth chips 140 to the third chip pads CP3 of the second controller chip 200b. The fourth upper wires UW4 may connect the fourth power/ground pads 143 of one of the fourth chips 140 to the fourth chip pads CP4 of the second controller chip 200b. The first and second chip pads CP1 and CP2 of the second controller chip 200b may be connected through wires to bonding pads of the package substrate 100.

Figure 23:
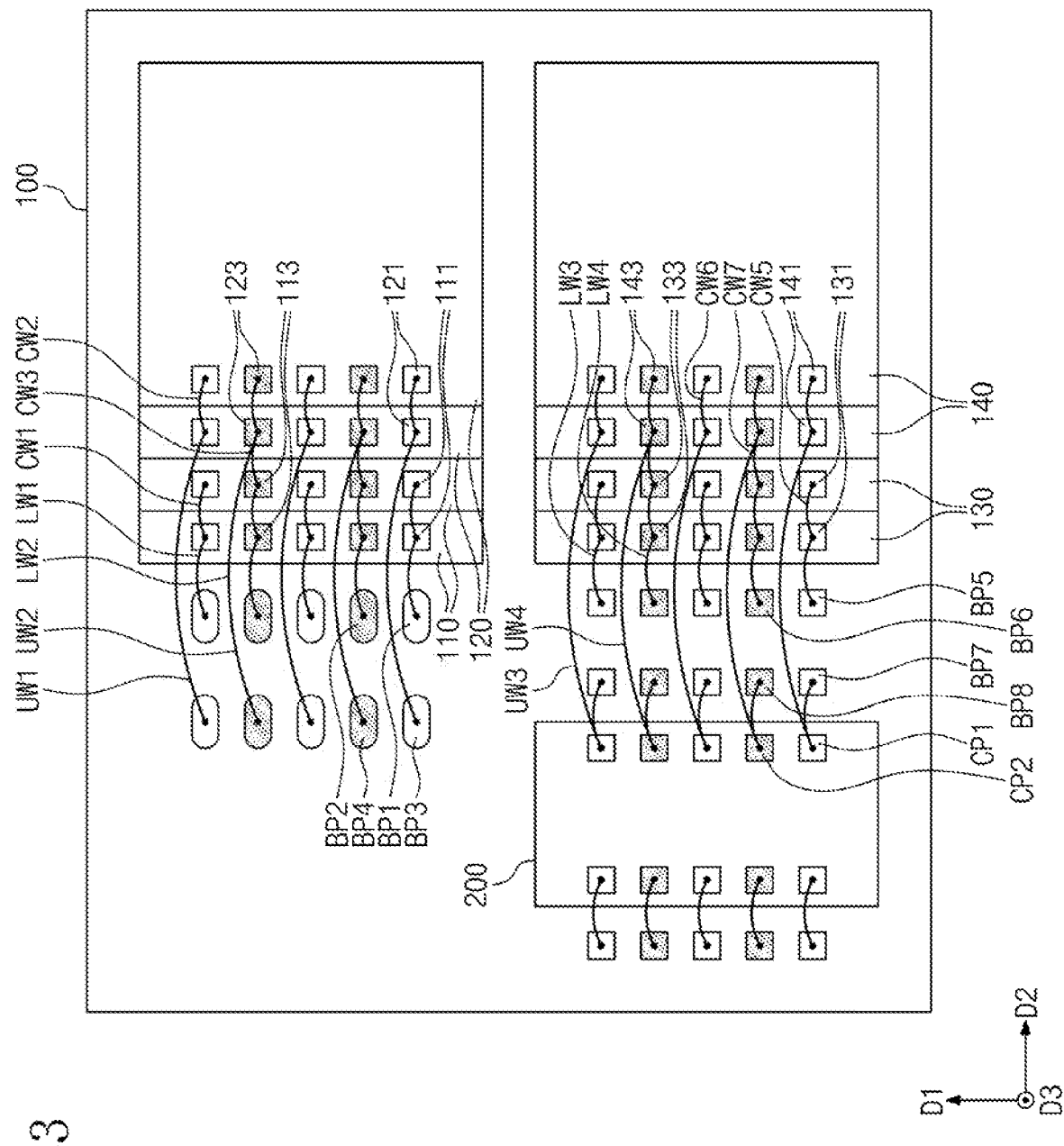
FIG. 23 illustrates a plan view of a semiconductor package according to some embodiments.

FIG. 23 illustrates a plan view of a semiconductor package according to some embodiments.

According to the embodiment shown in FIG. 23, a semiconductor package may include a package substrate 100, first to fourth chip stacks CS1 to CS4, a controller chip 200, first to fourth lower wires LW1 to LW4, first to fourth upper wires UW1 to UW4, first to sixth connection wires CW1 to CW6, and a molding layer 300.

As discussed with reference to FIGS. 2, 3A, and 3B, the package substrate 100 may be provided thereon with the first chip stack CS1 that includes first chips 110, and also with the second chip stack CS2 that include second chips 120 stacked on the first chip stack CS1.

The package substrate 100 may be provided thereon with the third and fourth chip stacks CS3 and CS4 that are spaced apart in the first direction D1 from the first and second chip stacks CS1 and CS2. The third chip stack CS3 may include a plurality of third chips 130 that are stacked on the package substrate 100, and the fourth chip stack CS4 may include a plurality of fourth chips 140 that are stacked on the third chip stack CS3.

The package substrate 100, as discussed above, may include first and second bonding pads BP1 and BP2 that are alternately arranged along the first direction D1, third bonding pads BP3 that are spaced apart in the second direction D2 from the first bonding pads BP1, and fourth bonding pads BP4 that are spaced apart in the second direction D2 from the second bonding pads BP2. In this case, the first and second bonding pads BP1 and BP2 may be adjacent to the first chip stack CS1.

In an implementation, the package substrate 100 may further include fifth and sixth bonding pads BP5 and BP6 that are alternately arranged along the first direction D1, seventh bonding pads BP7 that are spaced apart in the second direction D2 from the fifth bonding pads BP5, and eighth bonding pads BP8 that are spaced apart in the second direction D2 from the sixth bonding pads BP6. In an implementation, the fifth to eighth bonding pads BP5 to BP8 may be between the controller chip 200 and the third chip stack CS3.

As discussed with reference to FIGS. 2, 3A, and 3B, the first signal pads 111 of the first chips 110 may be electrically separated from the second signal pads 121 of the second chips 120. The first power/ground pads 113 of the first chips 110 may be electrically connected to the second power/ground pads 123 of the second chips 120.

As discussed above, the first upper wires UW1 may connect the second signal pads 121 of one of the second chips 120 to the third bonding pads BP3, and the second upper wires UW2 may connect the second power/ground pads 123 of one of the second chips 120 to the fourth bonding pads BP4.

The third upper wires UW3 may connect the third signal pads 131 of one of the third chips 130 to the fifth bonding pads BP5, and the fourth lower wires LW4 may connect the third power/ground pads 133 of one of the third chips 130 to the sixth bonding pads BP6.

The third signal pads 131 of the third chips 130 may be electrically separated from the fourth signal pads 141 of the fourth chips 140. The third power/ground pads 133 of the third chips 130 may be electrically connected to the fourth power/ground pads 143 of the fourth chips 140.

The third upper wires UW3 may connect the fourth signal pads 141 of one of the fourth chips 140 to the first chip pads CP1 of the controller chip 200, and the fourth upper wires UW4 may connect the fourth power/ground pads 143 of one of the fourth chips 140 to the second chip pads CP2 of the controller chip 200. The first chip pads CP1 of the controller chip 200 may be connected through bonding wires to the seventh bonding pads BP7, and the second chip pads CP2 of the controller chip 200 may be connected through bonding wires to the eighth bonding pads BP8.

By way of summation and review, with the development of electronic industry, improving reliability and durability of semiconductor packages has been considered. In order reduce a size and weight of electronic parts, a number of individual devices may be integrated into a single package and individual sizes of mounting parts may be reduced. Semiconductor packages operated at high frequency signals may have compactness and excellent electrical characteristics.

According to some embodiments, a semiconductor package may be configured such that signal pads of a lower chip stack may be connected through lower wires to a package substrate, and that signal pads of an upper chip stack may be connected through upper wires to the package substrate. Therefore, input/output signals of the lower and upper chip stacks may be input and output through different channels.

According to some embodiments, each of second upper wires connected to power/ground pads may be between first upper wires connected to signal pads of an upper chip stack. Therefore, when second chips are driven to operate, the second upper wires may shield electrical interference or crosstalk between the first upper wires. Accordingly, it is possible to help reduce or prevent a reduction in operating speed of the second chips and to help improve signal integrity of a semiconductor package.

One or more embodiments may provide a semiconductor package with improved electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor package, comprising:
   a package substrate including first bonding pads and second bonding pads that are alternately arranged in a single row along a first direction, third bonding pads that are spaced apart from the first bonding pads in a second direction intersecting the first direction, and fourth bonding pads that are spaced apart from the second bonding pads in the second direction;
a first chip stack including first chips that are stacked on the package substrate, each first chip including first signal pads and first power/ground pads that are alternately arranged in a single row along the first direction;
a second chip stack including second chips that are stacked on the first chip stack, each second chip including second signal pads and second power/ground pads that are alternately arranged in a single row along the first direction;
first lower wires that directly connect the first signal pads of one of the first chips to the first bonding pads;
second lower wires that directly connect the first power/ground pads of the one of the first chips to the second bonding pads;
first upper wires that directly connect the second signal pads of one of the second chips to the third bonding pads; and
second upper wires that directly connect the second power/ground pads of the one of the second chips to the fourth bonding pads,
wherein the first and second bonding pads are posed between the first chip stack and the third and fourth bonding pads, respectively.

2. The semiconductor package as claimed in claim 1, wherein each of the second upper wires is between two first upper wires that are adjacent to each other in the first direction.

3. The semiconductor package as claimed in claim 1, wherein a length of the second upper wires is substantially the same as a length of the first upper wires.

4. The semiconductor package as claimed in claim 1, wherein the first power/ground pads of the first chips are connected through connection wires to the second power/ground pads of the second chips.

5. The semiconductor package as claimed in claim 1, wherein the first upper wires are connected to the second signal pads of a lowermost one of the second chips.

6. The semiconductor package as claimed in claim 1, wherein the first chips and the second chips are stepwise stacked along the second direction.

7. The semiconductor package as claimed in claim 1, wherein:
the first chips and the second chips are stepwise stacked along the second direction, and
a stepwise direction of the second chips is opposite to a stepwise direction of the first chips.

8. The semiconductor package as claimed in claim 1, wherein the first bonding pads and the second bonding pads are closer to the first chip stack than the third bonding pads and the fourth bonding pads are to the first chip stack.

9. The semiconductor package as claimed in claim 1,
wherein the first signal pads and the first power/ground pads are alternately arranged along the first direction at a first pitch, and
wherein the first bonding pads and the second bonding pads are alternately arranged along the first direction at a second pitch, the second pitch being substantially the same as or greater than the first pitch.

10. The semiconductor package as claimed in claim 9, wherein the first pitch ranges from about 50 μm to about 200 μm.

11. A semiconductor package, comprising:
a package substrate;
a first chip stack including first chips that are stacked on the package substrate, each of the first chips including first signal pads and first power/ground pads that are alternately arranged in a single row along a first direction;
a second chip stack including second chips that are stacked on the first chip stack, each of the second chips including second signal pads and second power/ground pads that are alternately arranged in a single row along the first direction;
lower wires that directly connect the first signal pads and the first power/ground pads of the first chip stack to the package substrate;
upper wires that directly connect the second signal pads and the second power/ground pads of the second chip stack to the package substrate;
first connection wires that connect the first power/ground pads of the first chips to each other;
second connection wires that connect the second power/ground pads of the second chips to each other; and
third connection wires that connect the first power/ground pads of a first one of the first chips and the second power/ground pads of a first one of the second chips,
wherein the first one of the first chips is adjacent to the first one of the second chips,
wherein each of the second power/ground pads of the first one of the second chips is connected in common to one of the upper wires, one of the second connection wires, and one of the third connection wires, and
wherein each of the lower wires has a first length and each of the upper wires has a second length longer than the first length.

12. The semiconductor package as claimed in claim 11, wherein a number of the lower wires is the same as a number of the upper wires.

13. The semiconductor package as claimed in claim 11, wherein the package substrate includes:
first bonding pads and second bonding pads that are adjacent to the first chip stack and are alternately arranged along the first direction;
third bonding pads that are spaced apart from the first bonding pads in a second direction intersecting the first direction; and
fourth bonding pads that are spaced apart in the second direction from the second bonding pads, and
wherein the upper wires include:
first upper wires that connect the second signal pads of one of the second chips to the third bonding pads; and
second upper wires that connect the second power/ground pads of one of the second chips to the fourth bonding pads.

14. The semiconductor package as claimed in claim 13, wherein a length of the first upper wires is the same as a length of the second upper wires.

15. The semiconductor package as claimed in claim 11, further comprising:
a controller chip that is spaced apart from the first chip stack and the second chip stack and is on the package substrate,
wherein the controller chip includes first chip pads and second chip pads that are alternately arranged along the first direction, and
wherein the upper wires include:
first upper wires that connect the second signal pads of one of the second chips to the first chip pads; and
second upper wires that connect the second power/ground pads of one of the second chips to the second chip pads.

16. The semiconductor package as claimed in claim 15, wherein the package substrate includes first bonding pads and second bonding pads that are alternately arranged along the first direction between the first chip stack and the controller chip, and wherein the lower wires include:

first lower wires that connect the first signal pads of one of the first chips to the first bonding pads; and second lower wires that connect the first power/ground pads of one of the first chips to the second bonding pads.

17. The semiconductor package as claimed in claim 11, wherein the first chips and the second chips are stepwise stacked along a second direction intersecting the first direction.

18. A semiconductor package, comprising:

a package substrate including first bonding pads and second bonding pads that are alternately arranged in a single row along a first direction, third bonding pads that are spaced apart from the first bonding pads in a second direction intersecting the first direction, and fourth bonding pads that are spaced apart in the second direction from the second bonding pads;

a first chip stack including first chips that are stacked on the package substrate, each of the first chips including first signal pads and first power/ground pads that are alternately arranged in a single row along the first direction;

a second chip stack including second chips that are stacked on the first chip stack, each of the second chips including second signal pads and second power/ground pads that are alternately arranged in a single row along the first direction;

a controller chip that is spaced apart from the first chip stack and the second chip stack and is on the package substrate, the controller chip including first chip pads and second chip pads that are arranged in a single row along the first direction;

first connection wires that connect the first power/ground pads of the first chips to each other;

second connection wires that connect the second power/ground pads of the second chips to each other;

third connection wires that connect the first power/ground pads of a first one of the first chips and the second power/ground pads of a first one of the second chips;

first lower wires that directly connect the first signal pads of one of the first chips to the first bonding pads;

second lower wires that directly connect the first power/ground pads of the one of the first chips to the second bonding pads;

first upper wires that directly connect the second signal pads of one of the second chips to the first chip pads of the controller chip; and second upper wires that directly connect the second power/ground pads of the one of the second chips to the second chip pads of the controller chip, wherein the first one of the first chips is adjacent to the first one of the second chips.

19. The semiconductor package as claimed in claim 18, wherein the first bonding pads and the second bonding pads are closer to the first chip stack than the third bonding pads and the fourth bonding pads.

20. The semiconductor package as claimed in claim 18, wherein each of the second upper wires is between two first upper wires that are adjacent to each other in the first direction.

* * * * *